United States Patent
Schultz et al.

(10) Patent No.: US 6,879,631 B1
(45) Date of Patent: Apr. 12, 2005

(54) SELECTIVE COMPRESSION NETWORK IN AN MPEG COMPATIBLE DECODER

(75) Inventors: Mark Alan Schultz, Carmel, IN (US); Greg Alan Kranawetter, San Jose, CA (US)

(73) Assignee: Thomson Licensing S.A., Boulogne-Billancourt (FR)

( * ) Notice: Subject to any disclaimer, the term of this patent is extended or adjusted under 35 U.S.C. 154(b) by 780 days.

(21) Appl. No.: 09/319,763

(22) PCT Filed: Dec. 15, 1997

(86) PCT No.: PCT/US97/23075

§ 371 (c)(1),
(2), (4) Date: Jun. 11, 1999

(87) PCT Pub. No.: WO98/27743

PCT Pub. Date: Jun. 25, 1998

(30) Foreign Application Priority Data

Dec. 18, 1996 (EP) ............................................. 96402785

(51) Int. Cl.$^7$ ................................................ H04N 7/12
(52) U.S. Cl. .............................. 375/240.11; 375/240.23; 348/400.1
(58) Field of Search ......................... 348/400.1, 415.1, 348/416.1; 375/240, 240.11, 240.23

(56) References Cited

U.S. PATENT DOCUMENTS

| 5,818,530 A | * 10/1998 | Canfield et al. ............ 348/400 |
| 5,825,424 A | * 10/1998 | Canfield et al. ............ 348/416 |
| 5,847,762 A | * 12/1998 | Canfield et al. ............ 348/415 |

FOREIGN PATENT DOCUMENTS

| CA | 2151023 | 12/1995 | ............ H04N/7/24 |
| EP | 0687111 | 12/1995 | ............ H04N/7/24 |
| EP | 0707426 | 4/1996 | ............ H04N/7/26 |
| EP | 0814615 | 12/1997 | ............ H04N/7/50 |
| EP | 0814616 | 12/1997 | ............ H04N/7/50 |
| EP | 0817498 | 1/1998 | ............ H04N/7/50 |
| GB | 2296618 | 7/1996 | ............ H04N/5/92 |
| WO | 96/17478 | 6/1996 | ............ H04N/7/36 |

* cited by examiner

*Primary Examiner*—Jeffery Hofsass
*Assistant Examiner*—George A Bugg
(74) *Attorney, Agent, or Firm*—Joseph S. Tripoli; Joseph J. Laks; Ronald H. Kurdyla

(57) ABSTRACT

An MPEG decoder in a high definition television receiver decodes and decompresses MPEG coded data to produce decompressed image pixel blocks, and includes a motion compensation network coupled to a frame memory to produce finally decoded pixel data for display. The decompressed MPEG data is recompressed by plural parallel recompressors prior to storage in frame memory. Each recompressor receives a datastream of interleaved pixel data, and predicts and compresses interleaved pixel values during each clock cycle, respectively. One of the recompressors is de-energized in a reduced data processing mode when pixel data is subsampled prior to recompression. Subsampled data is re-ordered prior to recompression. Multiple parallel decompressors coupled to the frame memory provide pixel data to the motion processing network. A control unit insures an uninterrupted interleaved data flow to the decompressors by repeating last valid data when source data is interrupted.

8 Claims, 21 Drawing Sheets

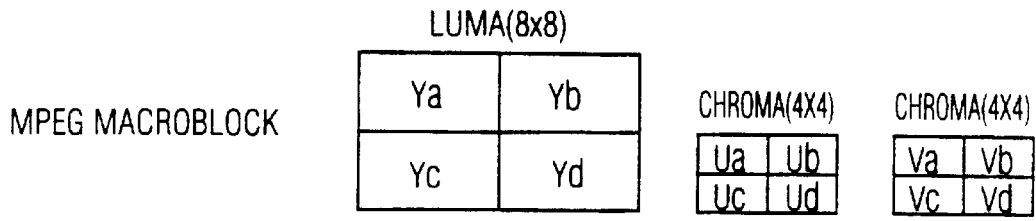
FIG. 2
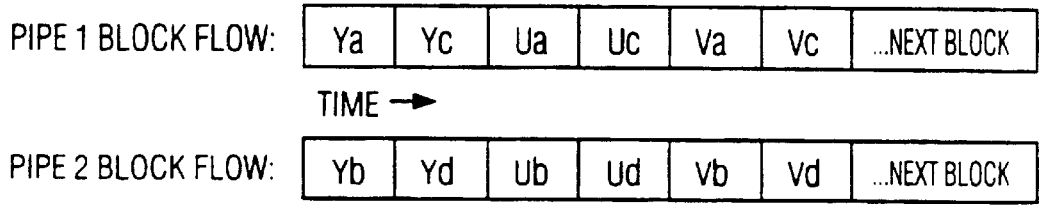
FIG. 3
U CHROMA BLOCK DATA IN PIPES
FIG. 4

OUTPUT FROM COMPRESSION BLOCK 40 ASSOCIATED WITH PIPE1

BLOCKS OF DATA SENT TO EXTERNAL MEMORY AFTER REMOVING THE INTERLEAVING:

BLOCK OF COMPRESSED 'A' DATA | a1' | a2' | a3' | a4' | a5' | a6' | a7' | a8' | ...
TIME →

BLOCK OF COMPRESSED 'B' DATA | b1' | b2' | b3' | b4' | b5' | b6' | b7' | b8' | ...
TIME →

BLOCK OF COMPRESSED 'C' DATA | c1' | c2' | c3' | c4' | c5' | c6' | c7' | c8' | ...
TIME →

BLOCK OF COMPRESSED 'D' DATA | d1' | d2' | d3' | d4' | d5' | d6' | d7' | d8' | ...
TIME →

FIG. 7

TWO INTERLEAVED COMPRESSED DATA BLOCKS READY FOR DECOMPRESSING
| a1' | b1' | a2' | b2' | a3' | b3' | a4' | b4' | a5' | b5' | a6' | b6' | a7' | b7' | a8' | b8' |
TIME →

FIG. 8

COMPRESSED DATA SENT TO THE EXTERNAL MEMORY

BLOCKS FROM A AND B

| m1' | m2' | m3' | m4' | m5' | m6' | m7' | m8' |

BLOCKS FROM C AND D

| n1' | n2' | n3' | n4' | n5' | n6' | n7' | n8' |

FIG. 17

SELECTIVE COMPRESSION NETWORK IN AN MPEG COMPATIBLE DECODER

FIELD OF THE INVENTION

This invention relates to processing digital image representative information.

BACKGROUND OF THE INVENTION

Rapid advances in digital technology have produced corresponding advances in digital image signal processing in various fields such as high definition television (HDTV). The MPEG (Motion Picture Experts Group) signal compression standard for MPEG-2 video processing (ISO/IEC International Standard 13818-2, Jan. 20, 1995) is a related development. This widely accepted image processing standard has been found to be particularly attractive for use with satellite, cable and terrestrial broadcast systems including HDTV systems.

A digital HDTV terrestrial broadcast system recently adopted as the Grand Alliance HDTV system in the United States defines a standard of digital broadcast of high definition (HD) program material which has been data compressed using the MPEG-2 compression standard. A description of the Grand Alliance HDTV system is found, for example, in the 1994 Proceedings of the National Association of Broadcasters, 48th Annual Broadcast Engineering Conference Proceedings, Mar. 20–24, 1994. The HD broadcast standard provides for image resolution up to 1920 pixels per line (horizontally) by 1080 lines (vertically). The MPEG-2 standard defines the procedures required to decompress the HD image for reproduction by a display device such as in a television receiver. About 80 Mega bits (Mb) of memory is required by an MPEG decoder to properly decode an HD image as defined in the terrestrial broadcast standard. About 96 Mb of memory would be required in a consumer receiver.

In an MPEG video signal decoder such as may be found in a television signal receiver, more than one image frame of memory is typically needed for decoding an MPEG coded digital datastream, which represents I, P and B image frames as known. Three frames of memory are generally needed for decoding an MPEG datastream. Two frames of memory are needed to store reference I or P frame data, and an additional frame of memory is used to store B frame data.

An MPEG decoder includes a DPCM loop associated with a motion compensation function for producing finally decoded pixel samples, as known. As disclosed in copending U.S. patent application Ser. No. 08/579,192, the DPCM loop is advantageously modified by incorporating a data compression network. This compression network re-compresses decompressed MPEG data before being conveyed to a frame memory, thereby reducing the memory requirements of the MPEG decoder. The DPCM loop is arranged so that the value of a pixel to be compressed is dependent on the results of a predictor circuit evaluating pixels to the immediate left, directly above, and diagonally to the upper left of the pixel being processed. The predictor operation is a real-time, computationally intensive serial operation. The predictor operation is important since more than one pixel value is involved, and because good compression requires accurate prediction rather than a "guess" at a pixel value.

SUMMARY OF THE INVENTION

In accordance with the principles of the present invention, an MPEG compatible signal processor decompresses compressed MPEG data. The decompressed data is data-reduced by a subsampling network and by a recompression network. The recompression network is selectively inhibited when the subsampling network is activated.

BRIEF DESCRIPTION OF THE DRAWINGS

FIGS. 2–17 depict pixel block processing formats helpful in understanding the operation of compression/decompression and associated networks shown in FIG. 1.

DETAILED DESCRIPTION OF THE PREFERRED EMBODIMENTS

In a disclosed embodiment of the invention, an MPEG decoder in a television receiver employs data reduction, including re-compression, between the decoder and the decoder frame memory from which image information to be displayed is derived. The system uses pipeline processing in consideration of predictor processor timing requirements, wherein three pixel (picture elements) values must be made available to predict the value of a given fourth pixel. Pipeline processing slows processing (reduces bandwidth), however. This matter is resolved by interleaving pixel data from independent 8×8 pixel blocks supplied from the MPEG decompressor. Interleaving increases processing speed since it allows pixel data to be processed on alternate clocks, so that a compressed pixel value is always being generated. The re-compression function uses a reduced number of compression operations and exhibits interleaved operation with shared functions to conserve integrated circuit area.

Figure 1:
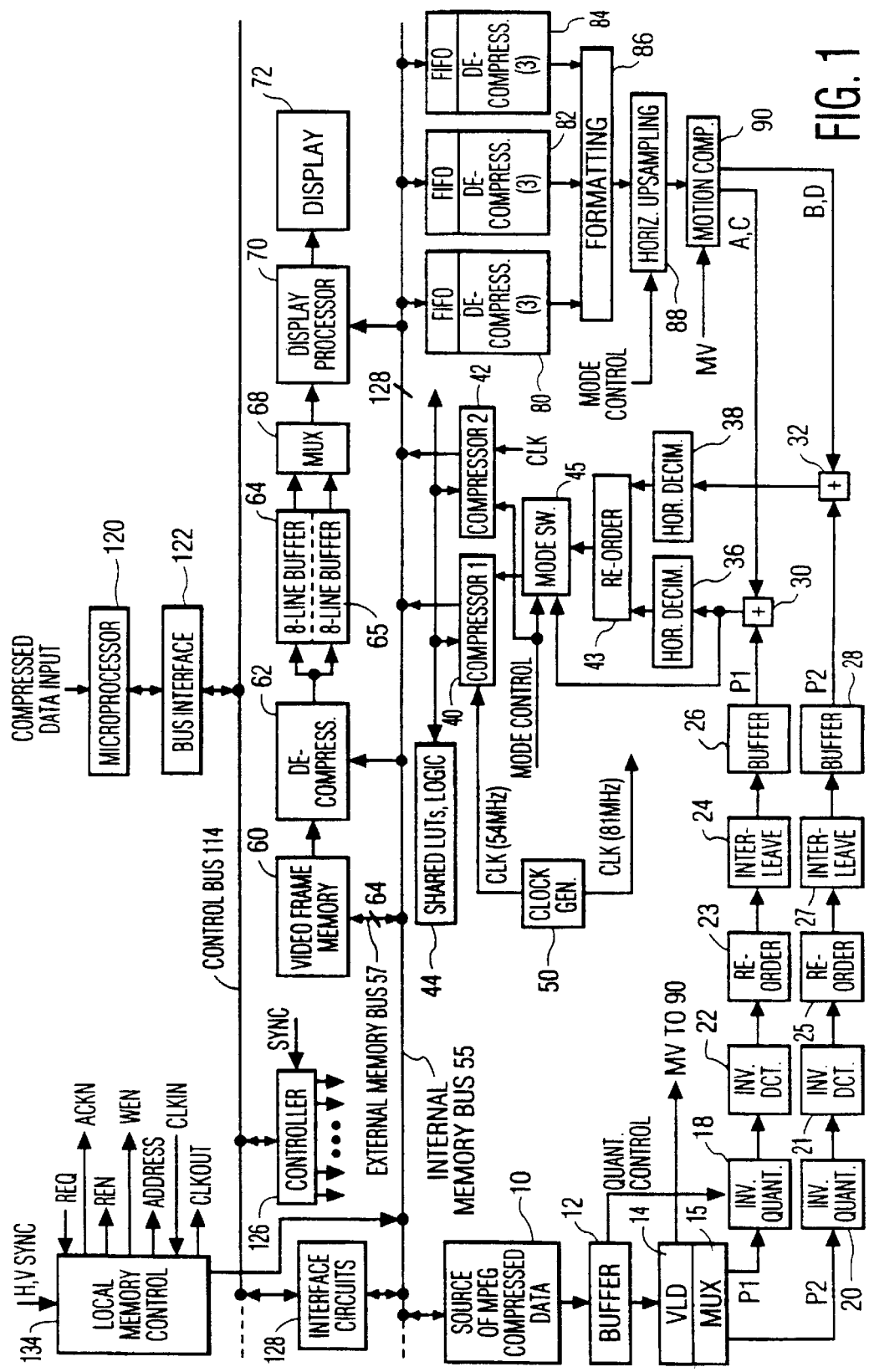
FIG. 1 is a block diagram of a portion of a television signal receiver employing an MPEG decoder and associated digital signal processing networks arranged in accordance with the principles of the present invention.

FIG. 1 depicts a portion of a digital video signal processor such as may be found in a television receiver for processing an input high definition video signal. The video processor includes functions found in a conventional MPEG decoder. An MPEG encoder and decoder are described, for example, by Ang et al. in "Video Compression Makes Big Gains," IEEE Spectrum, October 1991. These functions typically include input buffering, variable length decoding, inverse quantization, and inverse DCT transformation prior to associated motion compensation processing which produces finally decoded output samples. Additional information concerning these and related video signal processing functions is found in Weiss, *Issues in Advanced Television Technology* (Focal Press, Boston, USA).

The system of FIG. 1 receives a controlled datastream of MPEG coded compressed data from a source represented by unit 10 including a transport decoder which separates data packets after input signal demodulation. In this example the received input datastream represents high definition image material (1920 pixels/horizontal line×1088 horizontal lines) as specified in the Grand Alliance specification for the United States high definition terrestrial television broadcast system. The data rate of the 1920×1088 high definition information is 94,003,200 bytes/sec, determined as follows:

(1920$H$×1088$V$×30$F$×(8+4)$YC$)/$B$ where

H represents horizontal pixels,
V represents vertical lines,
F represents frames/sec,
YC represents (luminance+chrominance) bits, and
B represents 8 bits/byte.

In practice, the compressed MPEG datastream is provided via internal memory bus 55 and a compressed data interface included in unit 128, which receives data from control bus 114 under control of microprocessor 120. Microprocessor 120 receives the MPEG datastream via a compressed data input.

The input datastream from source 10 is in the form of data blocks representing 8×8 pixels. This data represents compressed, coded intraframe and interframe information. The intraframe information comprises I-frame anchor frames. The interframe information comprises predictive motion coded residual image information representing the image difference between adjacent picture frames. The interframe motion coding involves generating motion vectors that represent the offset between a current block being processed and a block in a prior reconstructed image. The motion vector which represents the best match between the current and prior blocks is coded and transmitted. Also, the difference (residual) between each motion compensated 8×8 block and the prior reconstructed block is DCT transformed, quantized and variable length coded before being transmitted. This motion compensated coding process is described in greater detail in various publications including the Weiss text and the Ang, et al. article mentioned above.

The MPEG decoder exhibits a reduced memory requirement which allows a significant reduction in the amount of external frame memory. As will be explained subsequently, this is accomplished by re-compressing decompressed video frames to be stored in memory, and by selectively horizontally filtering and decimating (i.e., subsampling or downsampling) pixel data within the decoder loop depending on the operating mode of the decoder. For example, in one mode the system provides anchor frame compression. In another mode the system provides compression after horizontal detail reduction by low pass filtering and downsampling.

The input compressed pixel data blocks are buffered by unit 12 before being variable length decoded by unit 14, which also produces motion vectors MV as known. Buffer 12 exhibits a storage capacity of 1.75 Mbits in the case of a main level, main profile MPEG datastream. Decoded compressed data blocks are output from unit 14 via a multiplexer (Mux) 15, which produces output datastreams P1 and P2. Outputs P1 and P2 represent dual data pipelines hereinafter referred to as pipe 1 (P1) and pipe 2 (P2). Pipe P1 contains a group of DCT coefficients for an 8×8 pixel block "A" of a given macroblock, followed by a group of DCT coefficients for an 8×8 pixel block "C" for that macroblock. The DCT coefficients are arranged in a diagonal or "zig-zag" scan format, as known. Pipe 1 conveys a sequence of such A, C blocks for a sequence of corresponding macroblocks. Pipe 2 similarly contains a group of DCT coefficients "B" and "D" for the given macroblock and for macroblocks sequenced therewith. The arrangement of pixel data for such pixel blocks and macroblocks in pipelined sequence is shown and will be discussed in connection with FIGS. 2–17.

The pixel block data are conveyed by the respective pipes in parallel data processing paths each including an inverse quantizer (18, 20), an inverse Discrete Cosine Transform (DCT) unit (22, 21), output FIFO buffers (26, 28), block re-ordering units (23, 25) block interleaving units (24, 27) and adders (30, 32). Decompression and transform decoding are respectively performed by the inverse quantization units and by the inverse DCT units in each pipeline before being applied to one input of adders 30 and 32 respectively.

Reordering units 23, 25 remove the zig-zag scan pattern of the inversely DCT transformed pixel data from units 21 and 22 to produce a horizontal line-by-line pixel scan sequence for each 8×8 block. Thus, in pipe 1 for example, the output of unit 23 represents pixel values of the form a1 a2 a3 . . . a63 a64 (for block A), c1 c2 c3 . . . c63 c64 (for block C), etc. Interleaving unit 24 uses a multiplexing technique to produce pipe 1 output data of the form a1 c1 a2 c2 a3 c3 . . . a64 c64. Interleaver 27 produces a similar sequence for blocks B, D.

The quantization step size of inverse quantizers 18 and 20 is controlled by a Quant Control signal from buffer 12 to assure a smooth data flow. Decoded motion vectors MV are provided from decoder 14 to a motion compensation unit 90 as will be discussed below. Decoder 14 also produces an inter/intra frame mode select control signal, as known, which is not shown to simplify the drawing. The operations performed by units 14, 18/20, 21/22 and 23/25 are the inverse of corresponding operations performed by an MPEG encoder at a transmitter. The MPEG decoder of FIG. 1 reconstitutes the received image using MPEG processing techniques which are described briefly below.

Reconstructed pixel blocks are respectively provided at the outputs of adders 30 and 32 by summing the residual image data from units 26 and 28 with predicted image data provided at the outputs of motion compensation unit 90 based on the contents of video frame memory 20. An entire frame of reconstructed image representative pixel blocks is stored in frame memory 60. In the interframe mode, motion vectors MV obtained from decoder 14 are used to provide the location of the predicted blocks from unit 90. The motion compensation process forms predictions from previously decoded pictures which are combined with the coefficient data (from the outputs of IDCT units 21 and 22) in order to recover the finally decoded samples. Motion compensation unit 90 operates in accordance with known MPEG compatible techniques as discussed, for example, in the MPEG specification and in the Weiss and Ang references mentioned previously. The A, C and B, D outputs of unit 90 represent decompressed interleaved pixel block data A, C and interleaved pixel block data B, D as will be discussed.

The image reconstruction process involving adders 30, 32, external decoder frame memory 60 and motion compensation unit 90 advantageously exhibits significantly reduced frame memory requirements due to the use of block-based parallel data compressors 40 and 42, and horizontal pixel decimation (subsampling) units 36 and 38 which reduce horizontal detail. The size of frame memory 60 may be reduced by 25%, 50% or more as a function of the data reduction achieved by recompression units 40, 42 and decimation by units 36, 38. Output data from decimation units 36 and 38 is processed by a block re-ordering unit 43 before being conveyed to compressor 40 in a reduced data operating mode when horizontal decimation is employed, as will be discussed. The effect of the re-ordering operation will be seen in connection with FIGS. 12 and 14 and related Figures. A Mode Control signal and a mode switch 45 modify the compressor operation in a reduced data operating mode when horizontal decimation units 36 and 38 are activated, as will be explained. Compressor 42 is disabled (e.g., de-energized) in the reduced data mode. At other times, e.g., when processing a high definition input signal, both compressors 40 and 42 are active.

Decompression units 80–84 perform the inverse of the compression performed by units 40 and 42. Unit 88 performs the inverse of the decimation performed by units 36 and 38. Additional details of these operations will be discussed subsequently. Formatting unit 86 discards unwanted decompressed lines of pixels until lines containing the decompressed pixels needed for motion compensation predictor processing by unit 90 are acquired. This selection process prevents unnecessary data from accumulating, and is advantageously used in a compression system (such as the disclosed system) which does not provide unique mapping in memory for every pixel. In this regard it is noted that a pixel value may have been compressed or quantized with 3, 4 or 5 bits for example, and the value of the pixel is not known until after decompression.

Processing an MPEG decoded input high definition datastream is advantageously accomplished by interleaving the input datastream prior to re-compression, and by processing the interleaved data using an interleaved data compression network. The data re-compression network includes similar compressors 40 and 42 which operate on an interleaved datastream. These compressors share certain logic circuits and look-up tables contained in unit 44, and operate in response to a locally generated 54 MHz (2×27 MHz) clock signal CLK produced by clock generator 50. The CLK signal is also applied to horizontal upsampling network 88. An 81 MHz (3×27 MHz) clock signal also produced by generator 50 is applied to decompressors 62, 80, 82 and 84, and to display processor 70.

Before proceeding with a description of the system operation, it will be helpful to understand the nature of the interleaved pixel data processing as illustrated by FIGS. 2–17. FIG. 2 illustrates a known MPEG macroblock configuration comprising luminance (Y) and chrominance (U, V) pixel block components. The luminance component of each macroblock is constituted by four 8×8 pixel luminance blocks Ya, Yb, Yc, and Yd. The chrominance component comprises 4×4 pixel "U" blocks Ua–Ud, and 4×4 pixel "V" blocks Va–Vd as shown. Interleavers 24 and 27 (FIG. 1) interleave these pixel blocks in data pipes P1 and P2 respectively as discussed previously and as shown in FIG. 3, which illustrates how the luminance and chrominance blocks are arranged for A,C and B,D pipeline processing. The pipelining process before interleaving is illustrated in greater detail in FIG. 4 with respect to the 4×4 pixel blocks which constitute a "U" chrominance component. FIG. 4 shows the result of the process by which units 23 and 25 place chrominance pixel blocks Ua and Uc in data pipe 1, and pixel blocks Ub and Ud in pipe 2. In the diagram, A1 represents the first pixel value (8 bit) of block A, A2 represents the second pixel value (8 bit) of block A, B1 represents the first 8 bit pixel value of block B, and so on through final values A16 and B16 to block D. Analogous observations pertain to the luminance pixel data.

Figure 5:
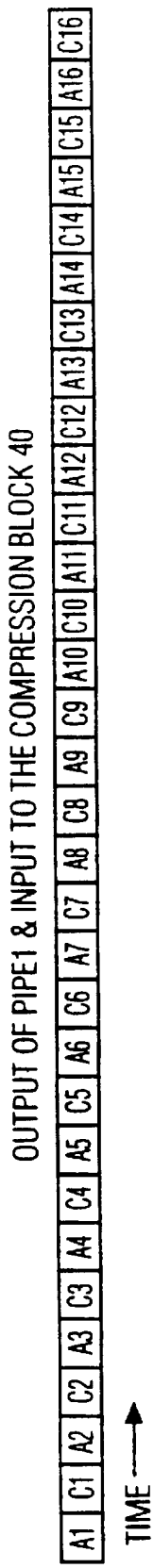
Figure 6:

FIGS. 5–7 illustrate pixel data arrangements assuming horizontal decimation is not performed by units 36 and 38 in FIG. 1. In such operating mode, 36 and 38 are bypassed depending on the amount of data reduction (decimation plus compression) desired for a given system configuration. Pixel data processing with horizontal decimation enabled is illustrated by FIGS. 11–17.

FIG. 5 depicts the A, C sequence of interleaved pixel data in pipe 1 conveyed from the output of interleaver 24 to compressor 40 from buffer 26 and adder 30 without decimation by unit 36. Similarly, pixel data in pipe 2 are conveyed to compressor 42 from interleaver 27 and adder 32 in the sequence B1, D1, B2, D2, . . . etc. Partitioning of the macroblock into sections represented by A, B, C, and D data groups is not critical. For example, in another system pipe P1 could convey A, B data or A, D data. Similarly, pipe 2 could convey a data combination other than B, D. In the illustrated embodiment the A, C data conveyed by pipe 1 corresponds to "even" data blocks in accordance with the MPEG specification, and pipe 2 B, D data corresponds to "odd" data blocks in the MPEG specification.

FIG. 6 illustrates the compressed pixel data output from first compressor 40 in the first pipe after Huffman coding. Each "x" in the FIG. 6 datastream represents a "don't care" condition produced to simplify the clocking process, whereby a continuous clock (rather than a less desirable stop/start clock) encompassing 8 bits of data for each clock cycle is used. A Write Enable signal (not shown) assures that only valid compressed data are written to memory when present. For every sixteen 8-bit (chroma) pixels (8 bytes) at the input, 16 bytes of compressed data are produced at the output. Not shown is the analogous pixel data output from second compressor 42 for blocks B, D in pipe 2. Details of a compression circuit suitable for use in compressors 40 and 42 will be shown and discussed with respect to FIG. 20.

After compression by units 40 and 42, the pixel data are conveyed via a 128-bit wide (i.e., 128 parallel data lines each conveying one bit) internal memory bus 55 (FIG. 1) and a 64-bit wide external memory bus 57 to external decoder frame memory 60. Memory 60 stores the pixel block data in de-interleaved form. De-interleaving may be performed by output circuits associated with compressors 40 and 42, or by circuits prior to memory 60, under control of a local microprocessor 120. These circuits use known signal processing techniques to perform the inverse interleaving function and have not been shown to simplify the drawing. FIG. 7 shows the form of the compressed pixel data sent to memory 60 after de-interleaving. Each compressed pixel is represented by 3 to 6 bits of data. In the block of compressed A data, "a1'" does not represent pixel a1 at this point but rather 8 bits constituted by a combination of compressed pixels and overhead data. The data length of a pixel is determined by the data itself and by the location of the pixel. The number of bits used to compress the data in this chroma block is 64 bits. The original chroma data was constituted by 128 bits (8×16 bits). Similar observations apply to the "B" through "D" data.

Referring back to FIG. 1, compressed pixel data stored in memory 60 are processed for display by means of a display processing network including a display decompressor 62, FIFO display buffer 64, multiplexer 68, and display processor 70. Display buffer 64 holds sixteen image lines, divided between a pair of eight-line buffers. Decompressed data for display processing is read from one of the line buffers via multiplexer 68 while the other line buffer is being filled with decompressed data from unit 62. Buffers 64 may be located in memory unit 60. Display processor 70 may include, for example, an NTSC coding network, circuits for conditioning the pixels for display, and a display driver network for providing video signals to image reproducing device 72, e.g., a high definition kinescope or other appropriate display means.

Prior to decompression by unit 62, the pixel data are re-interleaved to exhibit an "ab" block sequence as illustrated by FIG. 8. This interleaving may be performed by suitably addressing the read out operation of memory 60, or by input logic circuits associated with display decompressor 62. Similarly, pixels c and d are re-interleaved to produce a "cd" data sequence (not shown) prior to decompression.

Figure 9:
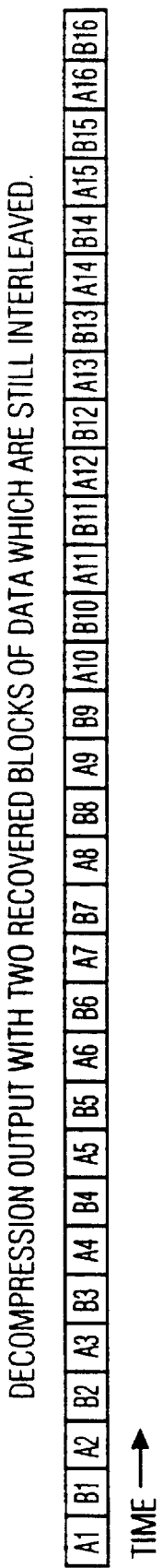
Figure 10:
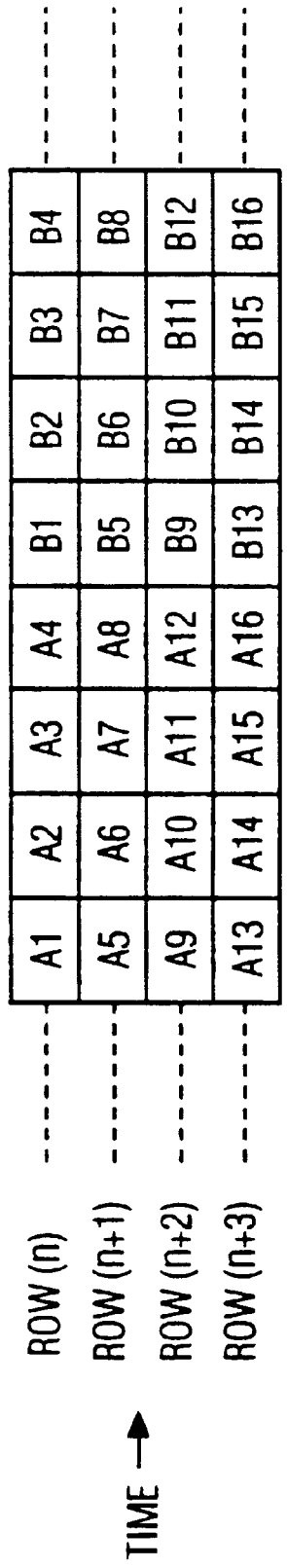

The re-interleaving sequences for display, i.e., ab and cd, differ from the original input interleaving sequences (ac and bd). The original interleaving permitted pixel data a and b, for example, to be accessed first and data a and b were processed in parallel. The re-interleaved display sequence is appropriate for display purposes where data from the same image frame is needed (pixels a,b and c,d are in the same image frame). The sequence of interleaved decompressed pixel data for the "ab" sequence is shown in FIG. 9. A similar sequence of interleaved decompressed pixel data for the "cd" sequence (C1, D1, C2, D2, C3, D3 . . . ) not shown is also produced. After processing by units 64, 68 and 70 the pixels of a given block are rearranged to a display format as shown in FIG. 10. This is a simplified example in 4:2:0 form rather than 4:2:2 form.

Referring to FIG. 1 again, the MPEG decoder loop also includes a decompression function performed by a plurality of decompressors 80, 82 and 84 in association with data formatting and horizontal up-sampling performed by units 86 and 88 respectively. The comments above concerning FIGS. 8 and 9 also apply to this control loop decompresson function, wherein prior to decompression the pixel data are interleaved by circuits associated with the decompressors to exhibit an "ab" (and "cd") data sequence as illustrated by FIG. 8.

FIGS. 11–17 illustrate pixel data sequence arrangements assuming horizontal decimation (i.e., subsampling or downsampling) by units 36 and 38 of FIG. 1 has been enabled. When data reduction in the form of horizontal decimation by units 36 and 38 is enabled, compressor 42 is disabled and only compressor 40 is used to compress data because of the reduced amount of data. Network 44 contains logic circuits and Look-Up Tables used by units 40 and 42. These circuits and tables are used by only one of the compressors when the other is deactivated in a reduced-data operating mode when data processing demands are less. In a high resolution mode when both compressors 40 and 42 operate, sharing these circuits and tables is facilitated by the interleaved data pipelining process. Specifically, unit 44 contains two Look-Up tables, one for use by compressor 40 and one for use by compressor 42. The LUT for compressor 40 is shared for compressing interleaved A and C data since these data are compressed at different times, such as on alternate clocks as will be discussed. The LUT for compressor 42 is similarly shared during compression of data B and D.

Figure 11:
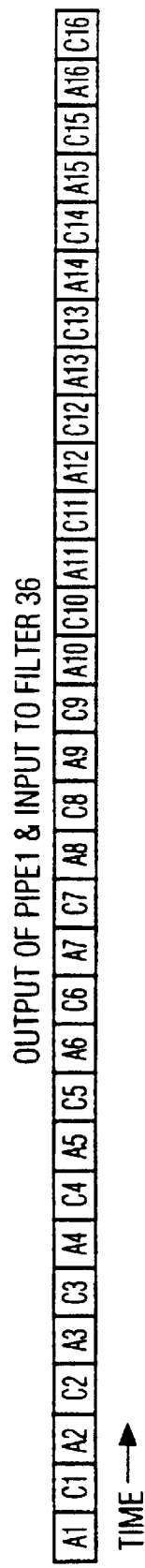
Figure 12:
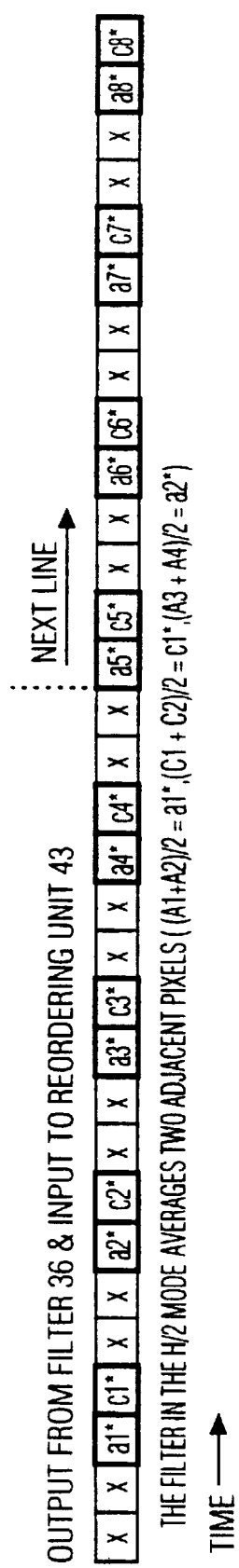
Figure 13:
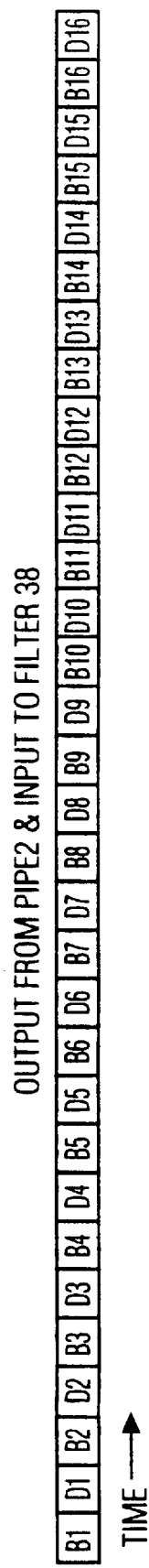
Figure 14:
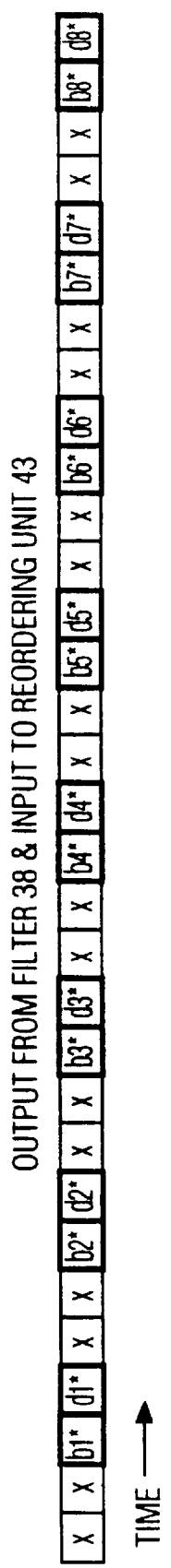
Figure 18:
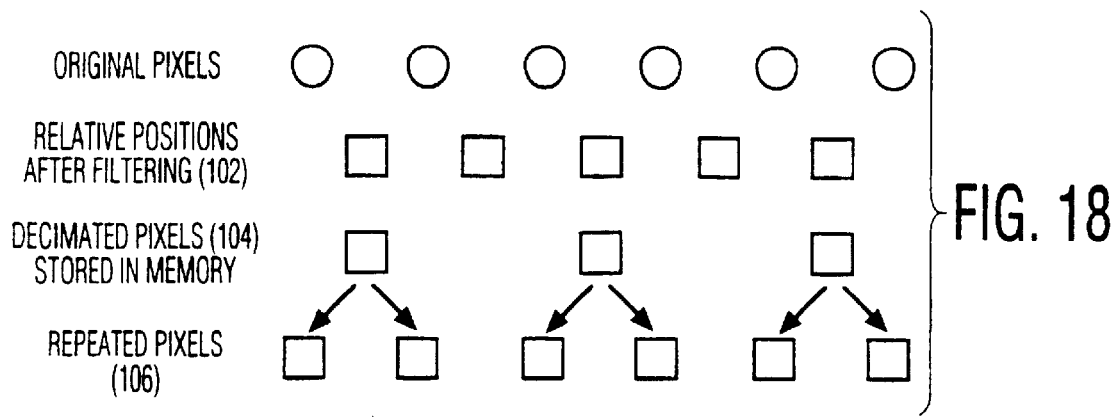
FIG. 18 depicts pixel subsampling and upsampling.

FIG. 11 depicts the sequence of pixel data applied from data pipe 1 to the input of decimation filter 36 in FIG. 1. Decimation by filter 36 produces the pixel data sequence of FIG. 12, which is applied to the input of reordering network 43. In FIG. 12 the "x"-labeled elements represent "don't care" or null data. In an H/2 mode whereby horizontal pixel data is subsampled by a factor of 2, filter 36 averages two adjacent pixels so that $a1^*=(A1+A2)/2,$ $c1^*=(C1+C2)/2,$ $a2^*=(A3+A4)/2,$ and so on. This process is illustrated in FIG. 18 as will be discussed. Decimation using other subsampling factors may also be used. FIGS. 13 and 14 similarly depict the sequence of pixel data applied from data pipe 2 to decimation filter 38 in FIG. 1.

Figure 15:
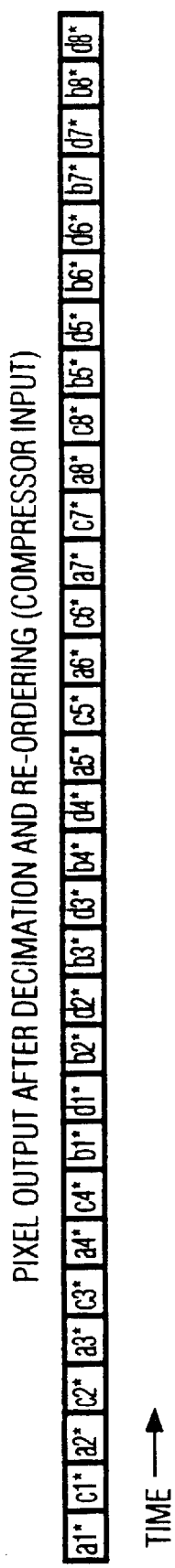

FIG. 15 shows the sequence of pixel data after decimation and reordering by unit 43 in FIG. 1. Specifically, the pixel data have been re-aligned by unit 43 to place them in a proper sequence for compression and storage in memory 60. In FIG. 15, pixel data a1 through c4 represent one image frame (a 2×4 matrix) after decimation, pixel data b1 through d4 represent a second image frame (2×4 matrix) after decimation, and so forth.

In FIG. 1, all the reordered pixel data from unit 43 are applied to compressor 40 via mode switch 45, since only one compressor is needed to compress the reduced amount of data resulting after decimation. Averaging data in the decimation process produces one pixel from two pixels, resulting in less data and a corresponding reduced need for data processing bandwidth. Consequently only one compressor is sufficient, and compressor 42 is inactivated. The compressors are enabled and disabled as required in the absence or presence of decimation in response to a Mode Control signal as will be discussed.

The reordering which occurs in reorder network 43 is not a straightforward procedure such as may occur with a first-in, first-out buffer. To minimize the complexity of motion compensation loop processing including horizontal decimation, reordering and recompression, the data is presented to compressor 40 in substantially the same format as data which has not been decimated horizontally by units 36 and 38. Providing reorder network 43 separate from recompressor 40 simplifies the circuit, because recompressor 40 does not have to distinguish between data requiring reordering from units 36 and 38, and data not requiring reordering from adders 30 and 32.

Figure 15A:
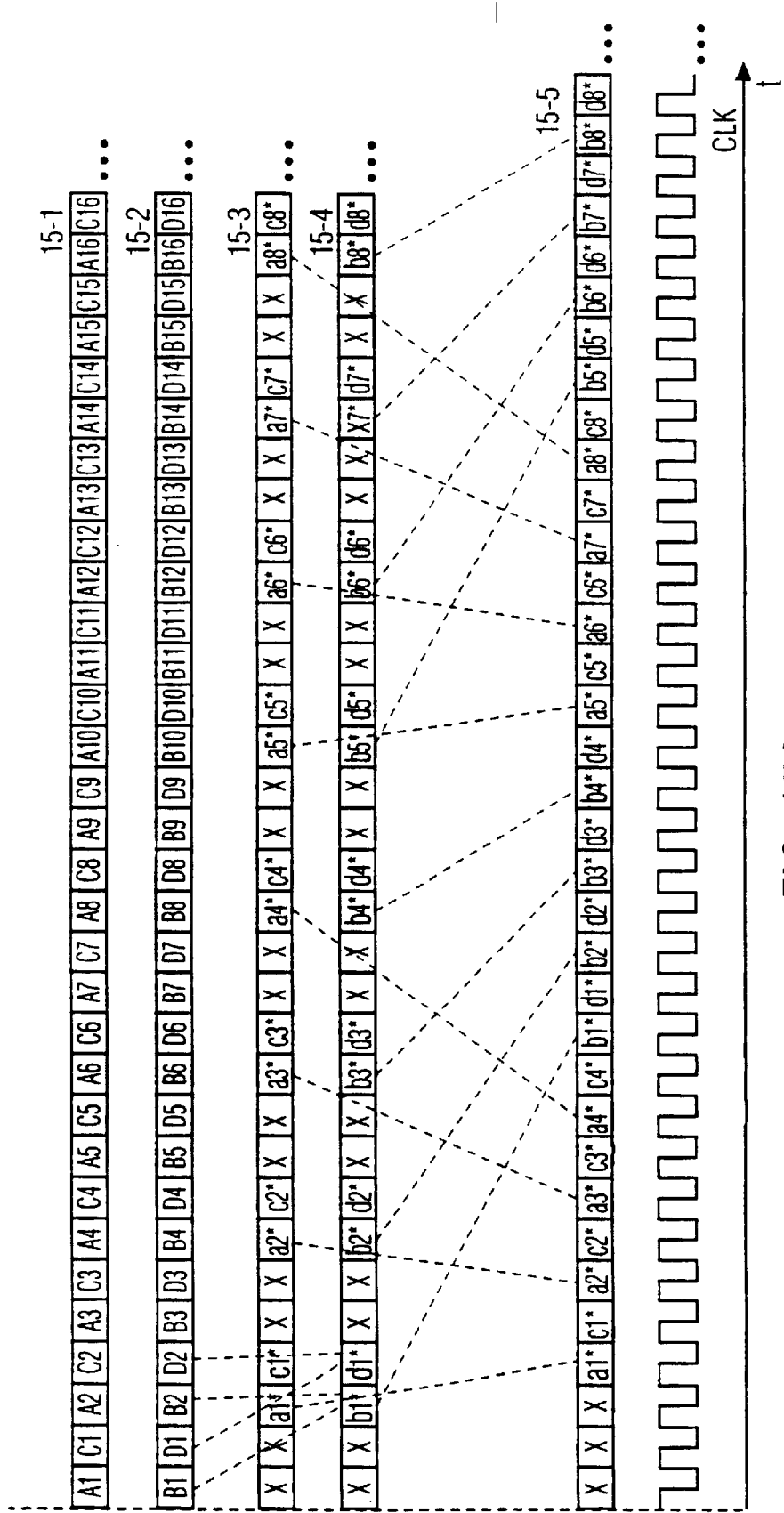

FIG. 15A is a compilation of FIGS. 11 to 15, and illustrates the data flow through horizontal decimation and reordering relative to pixel timing. Datastreams 15-1 and 15-2 of FIG. 15A respectively represent data out of adders 30, 32 and into decimator networks 36, 38. Datastreams 15-3 and 15-4 respectively represent data out of decimator networks 36, 38 which are input into reorder network 43. As discussed previously, pixels are interleaved as is seen in datastreams 15-1 through 15-4. Datastreams 15-1 and 15-3 represent data from pipeline P1, and datastreams 15-2 and 15-4 represent data from pipeline P2. Datastream 15-5 represents data out of the reorder network 43, which is input to recompressor 40 via switch 45. At the bottom of FIG. 15A is a pixel clock CLK provided to demonstrate the timing of data pixels as they pass through the system. As an exemplary illustration, selected data pixels will be followed through the reordering processes. The process is the same for data from either pipeline. The pixels of datastreams 15-1 and 15-2 represent a chrominance pixel macroblock. The process is the same for luminance pixel macroblocks, but the process is more complex because the rendering is spread over four 8×8 pixel blocks instead of four 4×4 pixel blocks. The larger macroblock causes the reordering to occur over a larger number of clock cycles with four times as much data. However, the reordering principles remain the same for both luminance and chrominance data.

Pixel B1 from datastream 15-2 is decimated to fifty percent and combined with pixel B2 to form an output data pixel of the same size of one input data pixel. The same occurs for pixels D1 and D2. Decimator network 38 buffers decimated data from pixels B1 and D1 until pixels B2 and D2 are processed. This is the reason output data from decimation network 38 is invalid during the first two clock cycles. Valid data occurs during the third clock cycle as pixel b1*. Data from pixel B1 is output during the first half of the third clock cycle, and data from pixel B2 is output during the second half of the third clock cycle. The fourth clock cycle produces pixel d1* in the same manner.

Data output from pipelines P1 and P2 passes to reorder network 43, which buffers the data and accesses particular pixels in the proper order to form a continuous data flow into compressor 40. As is seen from datastreams 15-4 and 15-5 of FIG. 15A, pixels b1*, b2*, b3* and b4* must be interleaved with pixels d1*, d2*, d3* and d4*, but after corresponding a and c pixels. Therefore the pixels reside within reorder network 43 for unequal times waiting to be output. For example, pixel b1* is received by reorder network during clock cycle 3 and output during clock cycle 12, whereas pixel b2* is received by reorder network during clock cycle 7 and output during clock cycle 14. Pixels are directed in reorder network 43 by a state machine controlled by microprocessor 120.

To maintain constant data flow, compressor 40 expects input pixel data in the interleaved format as shown in datastreams 15-1 and 15-2. After decimation networks 36 and 38, the pixel order is changed because the two pipelines P1 and P2 are downsampled by an order of 2 for each to supply half of the data in datastream 15-5. However, the downsampled data from P1 and P2 originate from vertically adjacent blocks of the image. Compressor 40 expects pixel data interleaved from horizontally adjacent blocks. Therefore, reorder network 43 combines the downsampled data from the order shown in datastreams 15-3 and 15-4 to the order shown in datastream 15-5. This order is substantially the same as the interleaved data not subject to downsampling in the decimation networks. Pixel blocks from both downsampled data and data not downsampled are the same size, that is they have the same number of pixels both horizontally and vertically. The only difference is that the downsampled pixel data blocks include pixel information from two horizontally adjacent pixel blocks, as previously described. This difference is transparent to compressor 40, which allows continuous data flow. Whereas this system reorders to combine horizontally adjacent pixel blocks into a downsampled pixel block, the spirit of the invention also encompasses a system which would combine pixel blocks having a different spatial relationship.

As is seen in FIG. 15A, reorder network 43 appears to need pixels a2* to a4* and a6* to a8* from decimator network 36 (datastream 15-3) for output (datastream 15-5) before they are available. Realistically, this can not and does not occur, but is shown to illustrate the different timing and delays which reorder network 43 must accommodate. To prevent data from being needed for output before being received by reorder network 43, unit 43 holds and delays sufficient data until all data may be processed, thereby providing a continuous data output as shown in datastream 15-5. The delay occurs with the first data to flow through pipelines P1 and P2 and reach reorder network 43, such as occurs when a television receiver is initially energized, when a channel is changed, or at any time data synchronization is established. After an initial delay, data is continuous without losing clock cycles.

Figure 16:
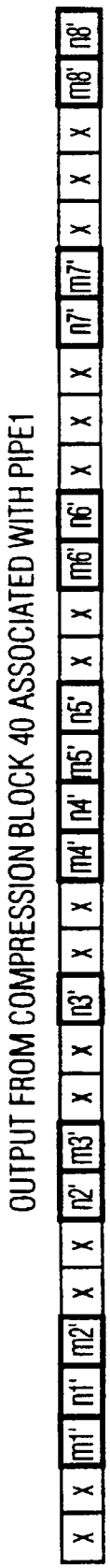

FIG. 16 depicts the sequence of compressed pixel data from the output of compressor 40. In FIG. 16, compressed data "m" designate compressed pixel data constituted by data derived from pixels a and b after decimation (i.e., a 4×8 pixel block produced after decimating an 8×8 pixel block). Similarly, compressed data "n" designate compressed data constituted by data derived from pixels c and d after decimation. Pixel data a and b are in the same image field, and pixel data c and d are in the same image field. The pixel block compression process performed by compressor 40 is designed to operate with respect to 8×8 pixel blocks. After decimation, a resulting 4×8 pixel "a" block and a 4×8 pixel "b" block are combined to produce an 8×8 pixel block which is compressed to produce block "m." Analogous observations pertain to the formation of compressed blocks "n" from decimated 4×8 blocks "c" and "d." In this manner blocks in the same image frame are properly aligned for efficient MPEG decoding. FIG. 17 depicts the arrangement of the properly frame sequenced compressed blocks as conveyed to and stored by memory 60.

The horizontal detail reduction produced by the decimation network further reduces decoder memory requirements by reducing the number of pixel values that are stored in memory 60. Decimation network 36, 38 employs a horizontal spatial low pass filter followed by 2:1 horizontal decimation (downsampling) before providing data to memory 60. After decompression by units 80, 82 and 84, the resolution of image information from memory 60 is reconstituted by unit 88 using a pixel repeat up-sampling process. The up-sampling process is not required between display decompressor 62 and display processor 70 since processor 70 provides the required horizontal sample rate conversion. It is expected that display decompressor 62 and processor 70 will not perform upsampling in a reduced cost receiver because of the reduced display resolution provided by such a receiver. In such case memory reduced decoded frames have higher resolution than a standard definition display. For example, to decode and display a 1920×1088 pixel video sequence on a 720×480 pixel display device requires that images stored in frame memory have a resolution of 960× 1088 (with horizontal decimation by a factor of two). Thus display decompressor 62 does not need to upsample images, but display processor 70 will have to downsample the 960×1088 resolution image to 720×480 to be suitable for display.

Figure 19:
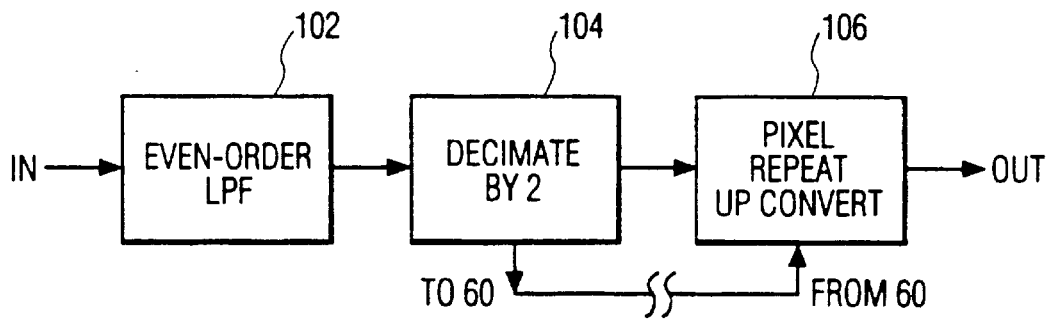
FIG. 19 is a block diagram of apparatus for performing the process depicted in FIG. 18.

FIGS. 18 and 19 respectively illustrate the general arrangement of elements associated with the pixel subsampling process as performed by units 36, 38 in FIG. 1, and pixel upsampling as performed by unit 88. In units 36 and 38 the original pixels are first low pass filtered by an even order low pass filter 102 before being decimated by two, whereby every other pixel value is removed by unit 104. These pixels are stored in memory 60. Afterwards, pixel data from memory 60 are repeated by element 106 of upsampling unit 88 using well known techniques.

In this example filter 102 is an 8-tap symmetrical FIR filter. This filter operates in the horizontal spatial domain and filters across block boundaries. The 8-tap filter has the effect of shifting the relative position of the output pixels by one-half sample period relative to the input, as shown in FIG. 18. As also shown in FIG. 18, the pixel repeat up-sampling has the effect of maintaining the same spatial position of the downsampled/upsampled pixels relative to the original pixels. Decimation filter unit 104 may be a two-tap filter so that for input pixels x and y the filter output is (x+y)/2, and decimation is accomplished by dropping every other pixel. This filter does not cross the block boundary, is easy to implement, and is a good choice for horizontal decimation.

The television receiver system shown in FIG. 1 has been simplified so as not to burden the drawing with excessive detail. For example, not shown are FIFO input and output buffers associated with various elements of the system, read/write controls, clock generator circuits, and control signals for interfacing to external memories which can be of the extended data out type (EDO) or synchronous type (SDRAM). The system of FIG. 1 additionally includes a microprocessor 120 for sending and receiving data, read/write enable and address information for example, bus interface 122 and controller 126 coupled to an internal control bus 114. In this example microprocessor 120 is located external to the integrated circuit containing the MPEG decoder.

Display processor 70 includes horizontal and vertical resampling filters as needed to convert a decoded image format to a predetermined format for display by unit 72. For example, the system may receive and decode image sequences corresponding to formats such as 525 line interlaced, 1125 line interlaced, or 720 line progressive scan. Processor 70 also produces clocks and H, V, sync signal associated with the image display, and communicates with frame memory 60 via internal memory bus 55.

External bus interface network 122 conveys control and configuring information between the MPEG decoder and external processor 120, in addition to input compressed video data for processing by the MPEG decoder. The MPEG decoder system resembles a co-processor for microprocessor 120, e.g., microprocessor 120 issues a decode command to the MPEG decoder for each frame to be decoded. The decoder locates the associated header information, which in turn is read by microprocessor 120. With this information microprocessor 120 issues data for configuring the decoder, e.g., with respect to frame type, quantization matrices, etc., after which the decoder issues appropriate decode commands. Variable length decoder 14 communicates via memory bus 55, and interfacing circuits 128 facilitate communication between memory bus 55 and control bus 114.

Mode control data, programmed by the receiver manufacturer, is conveyed by microprocessor 120 in association with memory controller 134 and controller 126 for establishing the compression/decompression factors for units 40, 42 and 80–84, and for controlling the status of the compression and decompression networks and the upsampling and downsampling networks as required by system design parameters. Microprocessor 120 also partitions memory 60 into frame storage sections, frame storage and bit buffers, and on-screen display bit map sections for MPEG decoding and display processing. Local memory control unit 134 receives Horizontal and Vertical Sync (e.g., from unit 70) and data Request inputs, and provides Acknowledge outputs as well as memory Address, Read Enable (Ren), and Write Enable (Wen) outputs to various system circuits including buffer control circuits. Unit 134 generates real time address and control signals for controlling memory 60. Output clock signals CLKout are provided in response to input clock in signal CLKin, which may be provided by a local clock generator such as unit 50. The system of FIG. 1 can be used with all Profiles and Levels of the MPEG specification in the context of various digital data processing schemes such as may be associated with terrestrial broadcast, cable, and satellite transmission systems, for example.

In this embodiment video frame memory 60 is located external to an integrated circuit which includes the MPEG decoder and associated elements in FIG. 1. Display processor 70 may include some elements which are not on the MPEG decoder integrated circuit. The use of such an external memory device allows the manufacturer of the receiver to select a memory device which is economically sized so as to be compatible with the intended use of the receiver, e.g., for full high definition display or reduced definition display, when the receiver receives a high definition datastream. The large amount of memory normally used for MPEG decoding presently requires that the memory be external to the decoder integrated circuit as a practical matter. Future advances in technology may permit the memory to be located on the same integrated circuit as the MPEG decoder elements. However, the use of an external memory device gives a manufacturer the freedom to choose a memory size consistent with the display resolution and other features of the receiver.

In practice, a receiver manufacturer will decide whether to configure a receiver as an expensive premium model with extended features, or as a more economical model with fewer features. One of the features of interest is the resolution of a displayed image. In a reduced cost receiver, factors which contribute to cost reduction include a less expensive reduced resolution image display device, and the amount of memory associated with the MPEG decoder.

In this example the memory requirement drops to 64 Mbits when the compressor network compresses data 25%, and the memory requirement drops to an even-more economical 48 Mbits when data is compressed 50%. The 25% compression factor would be associated with a full HD image display and would be virtually indistinguishable from full MPEG decoding without compression. With 50% compression a trained observer may be able to find barely noticeable artifacts. In either case the decoded image sequence would exhibit full 1920×1088 HD resolution for display by a full HD resolution image display device.

Full HD image resolution is not required in some cases, such as when a receiver model uses an inexpensive display device with less than full HD resolution capability. In such case it is desirable to receive and decode HD information without displaying full HD resolution images. In such a receiver decimator network 36, 38 and compressor network 40 can be used together to significantly reduce the decoder memory requirements. For example, the decimator network may horizontally decimate data by a factor of 2, and the compressor network may compress the decimated data by 50%. This results in a greatly reduced decoder memory requirement of 32 Mbits. In this case an image for display exhibits 960×1088 resolution, which is sufficient for either 1H or 2H receiver applications. Thus a low cost receiver capable of decoding full HD image datastreams can be constructed using only 32 Mbits of MPEG decoder memory. The operation described above is accomplished in response to the Mode Control signal provided to switch 45 by microprocessor 120. Depending on whether the MPEG decoder is situated in a high definition receiver or a receiver with reduced resolution, microprocessor 120 is programmed to determine the amount of compression and whether or not the decimator network is enabled to downsample data, or is bypassed.

The system of FIG. 1 exhibits a first data processing mode for processing a signal containing a large amount of data such as a high definition television signal for display by a high definition display device, and a second mode for processing a reduced amount of data. The second mode may be employed, for example, in an economical receiver including a reduced cost display device with less data resolution capability (i.e., a non-HDTV display device).

The state of switch 45 in FIG. 1 is controlled by the Mode Control signal which may be programmed by a receiver manufacturer to indicate the type of data to be displayed by the receiver, e.g., high definition (first mode) or less than high definition (second mode). Switch 45 would be controlled to produce first mode operation if a received high definition signal is to be displayed by a high definition display device, and second mode operation in the case of a high definition input signal being subsampled by units 36 and 38 to produce less than high definition image information for reproduction by a more economical display device having less than high definition resolution.

In the first mode, decimator units 36 and 38 are bypassed and data blocks to be compressed are conveyed directly to compressor 42, and to compressor 40 via switch 45. In this mode the Mode Control signal is applied to a control input of compressor 42 for enabling compressor 42. In the second mode, the state of the Mode Control signal disables compressor 42 by removing power from compressor 42 in this embodiment, while enabling the data from adder 30 to be conveyed to active compressor 40 via switch 45. Disabling compressor 42 by removing power is particularly advantageous in an integrated circuit device intended to process HDTV information, because of the power (heat dissipating) limitations of such integrated circuits due to high clock frequencies, large surface area, and the large number of active elements integrated thereon. In a gated clock system, removing power can effectively be accomplished by stopping the compressor clock. An additional advantage of such operation is that the compressor need only operate in similar block processing modes such as 8×8 and 4×8. That is, compressor 40 for example need not be re-programmed to process 4×8 pixel blocks as produced by the decimation process. Block reordering unit 43 rebuilds blocks after decimation to produce, from 4×8 pixel blocks, an 8×8 pixel block compatible with the compressor block processing algorithm.

The Mode Control signal is also applied to a control input of horizontal upsampling network 88 for bypassing the upsampling function in operating modes when decimation by units 36 and 38 is not employed. For this purpose unit 88 may employ a relatively simple switching arrangement for switching the output signal from unit 86 directly to unit 90 in such bypass mode.

Compression prior to storing data in memory 60 requires that data be decompressed prior to unit 90 in the motion compensation processing loop. This is accomplished by block-based decompressors 80, 82 and 84, which exhibit the inverse of the operation of compressors 40 and 42. Block-based display decompressor 62 uses a decompression technique similar to that used by compressors 80–84, and decompresses stored pixel data before being conveyed to display processor 70. When downsampling network 36, 38 is enabled prior to memory 60, output data from memory 60 is upsampled prior to unit 90 in the motion compensation processing loop by unit 88, which exhibits the inverse of the operation of network 36, 38.

The system of FIG. 1 advantageously employs a plurality of parallel block decompressors represented by units 80, 82 and 84 in the motion compensation loop. Nine decompressors are used in this example, three in each of units 80, 82 and 84, to allow all pixels to be decompressed individually. Each of these decompressors has an associated FIFO input buffer. Three decompressors (e.g., in unit 80) are used to decompress luminance pixel data in an MPEG forward prediction mode, and three decompressors (e.g., in unit 82) are used to decompress luminance pixel data in an MPEG backward prediction mode. Since chrominance information is half that of luminance, only three decompressors (e.g., in unit 84) are used to decompress chrominance pixel data. The use of all nine decompressors is needed for worst case MPEG B-picture decoding, which requires bi-directional motion compensation predictive processing. Thus B-picture prediction requires two image frames (forward and backward), while MPEG P-picture prediction requires only one image frame.

The motion compensation predictor block may not (and often does not) occur on a block boundary. Instead, several blocks may have to be called from frame memory 60. In a worst case situation in an MPEG-2 system with one-half pixel resolution, the motion compensation predictor block may overlap six blocks. Thus six blocks must be accessed from memory. In a system such as the disclosed system with recompression in the motion compensation loop (via units 40, 42), pixels cannot be accessed directly. All the block pixels must first be decompressed, which requires much overhead in the six block worst case situation and produces much more data than is needed. Unneeded pixel information is discarded by formatting unit 86 as mentioned previously, but only after all pixels have been decompressed.

In large data processing situations such as the six-block situation mentioned above, decompression before storage greatly increases the buffer memory size requirements associated with handling the decompressed pixel information. Instead, it has been found to be preferable in the disclosed system to decompress data in parallel as disclosed, and to afterwards discard (via unit 86) unneeded decompressed pixel data that is not associated with the predictor block. This procedure advantageously requires significantly less buffer storage capacity. Thus although the buffer memory bandwidth (data capacity) requirement is reduced, more integrated surface area is needed. However, the use of several decompressors in parallel produces the additional advantage of faster operation and associated faster access to the pixel data needed for motion compensation predictor processing.

The plural decompressors are not pipelined. Each decompressor and its associated buffer operates independently to deliver data, so that pixel data are delivered quickly. Delays in the operation of one decompressor/buffer network do not affect the operation of other decompressor networks. The decompressors also exhibit interleaved operation with respect to pixel data, which facilitates the independent operation of each decompressor. Also like the compressor network, decompressors 80, 82 and 84 share a common look-up table (LUT) in unit 44.

Various types of compression, including quantization and transformation, may be used by network 40, 42 depending on the requirements of a particular system. The disclosed system uses fixed-length compression, although variable length compression or adaptive fixed/variable compression may also be used.

The type of compression used should preferably exhibit certain characteristics. Each block should be compressed a predetermined amount so that the location of each compressed block is easily determined. Each block should be compressed/decompressed independently of other blocks. Thus any block can be accessed without having to read any other block. The compression/decompression process should not produce objectionable artifacts in a reproduced image. A compression factor of 25% is essentially transparent compared to conventional decoder processing without such compression. At 50% compression the results are less transparent, but the visible results are acceptable and are not considered to be significantly different compared to conventional decoder processing without compression and memory reduction.

Figure 20:
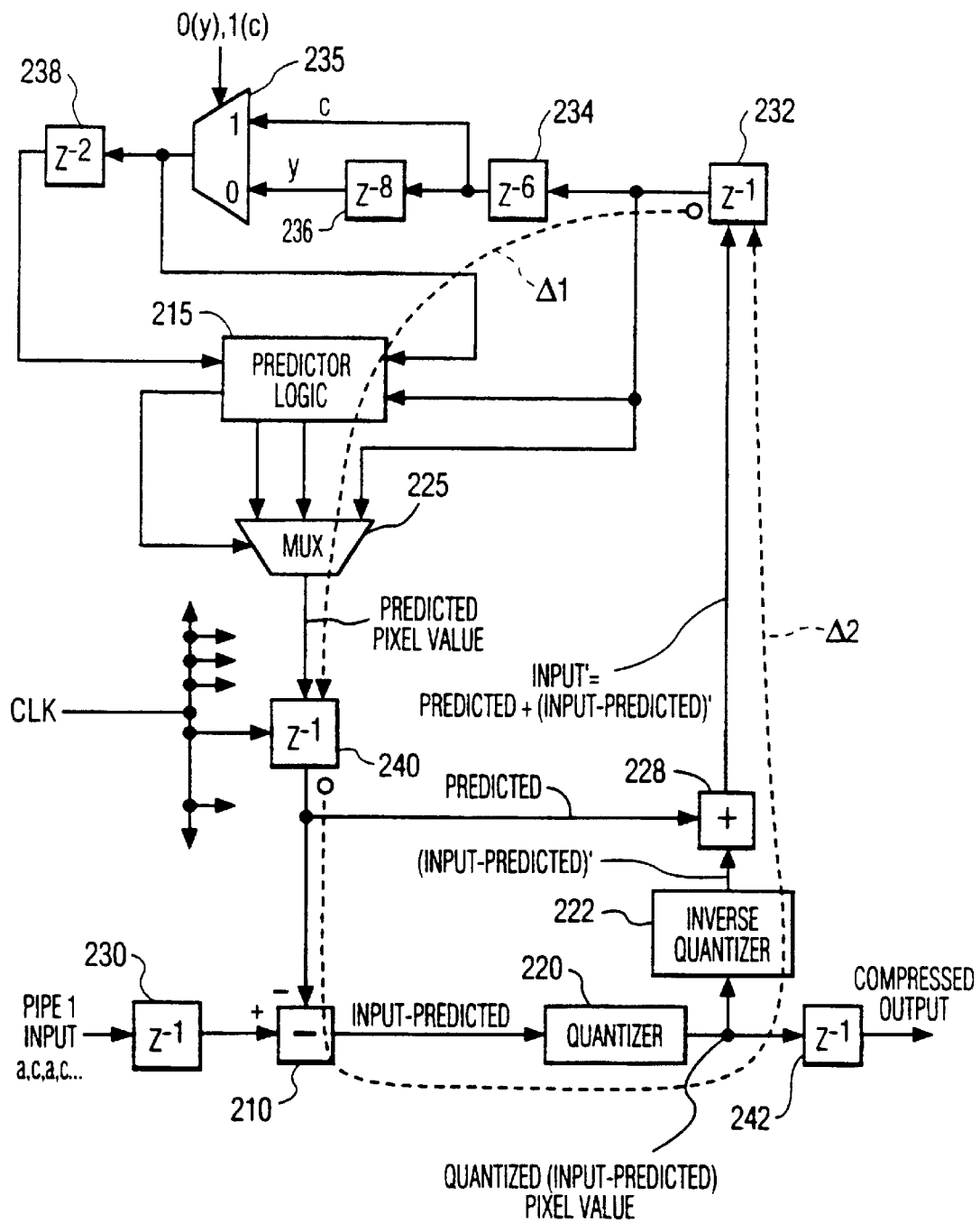
FIG. 20 shows details of a compression network of FIG. 1.

FIG. 20 illustrates the fixed compression network used in each of recompressors 40 and 42 in FIG. 1. The compression network employs a differential pulse code modulation (DPCM) loop with adaptive prediction. The philosophy of such DPCM processing with prediction is to remove mutual redundancy between successive pixels, and produce only difference information. This well-known process is generally described by A. K. Jain in *Fundamentals of Digital Image Processing* (Prentice-Hall International), page 483 et seq.

Figure 22:
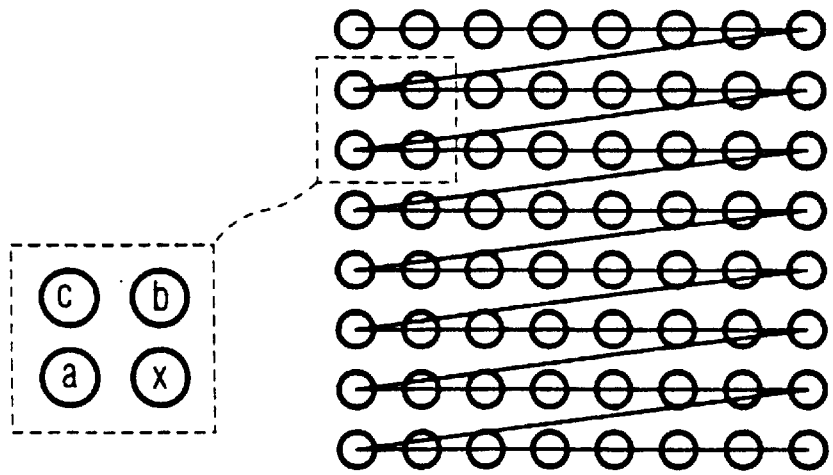
FIG. 22 depicts a pixel arrangement helpful in understanding aspects of the operation of the network shown in FIG. 20.

Before discussing the circuit of FIG. 20, reference is made to FIG. 22. FIG. 22 shows an exemplary arrangement of a group of four pixels a, b, c and x (the pixel to be predicted) associated with the predictive processing operation of the DPCM network. This group of pixels is referenced in the 8×8 pixel block shown in FIG. 22. Each pixel block is scanned in a raster manner as shown in FIG. 22, from left to right in a downward direction, In this example, for luminance information, pixel b is delayed by one pixel interval relative to pixel c, pixel a is delayed by a seven pixel interval relative to pixel b, and pixel x is delayed one pixel interval relative to pixel a. For chrominance information, pixel "a" is delayed by a three pixel interval.

In DPCM predictive processing the current pixel being coded is predicted by using previously coded pixels, which are known to decompressors 62, 80, 82 and 84 (FIG. 1). In FIG. 22, where pixel x is the pixel value to be predictively coded, pixels a, b and c have been predictively coded previously and are known to the decompression networks. A prediction of x, $X_{pred}$, uses the values of a, b and c in accordance with the following pseudo code, which describes the algorithm logic to be used:

```
if      (|a-c| < e₁ && |b-c| > e₂),    X_pred = b
else if (|b-c| < e₁ && |a-c| > e₂),    X_pred = a
else                                    X_pred = (a+b)/2
```

Values e1 and e2 are constants representing predetermined thresholds. This algorithm is used only for pixels not located in the first row or the first column of the block being processed. Some exceptions are handled as follows: the first pixel in a block is coded very finely without reference to any other pixel, pixels in the first row use pixel value a as the predictor, and pixels in the first column use pixel value b as the predictor. Basically, this algorithm attempts to detect an edge. In the first case, a vertical edge is suggested between pixels c and b and between pixels a and x. Thus b is the best predictor. The second case suggests a horizontal edge between a and c and between b and x. Thus a is the best predictor. In the third case, no obvious edge is found. In this case both a and b are equally good predictors, so their average value is used.

The compression network of FIG. 20 quantizes difference (residual) pixel values produced as a result of DPCM processing. FIG. 20 uses an interleaved DPCM loop with two predetermined delays and parallel rather than serial processing. The circuit shown in FIG. 20 corresponds to that employed by recompressor 40 in FIG. 1 for processing interleaved pixel data A and C in the sequence shown in FIG. 5. A similar circuit is used by compressor 42 for compressing interleaved pixel data B and D. Since the network of FIG. 20 compresses a residual value, the predictor loop must finish processing a pixel of a given block before the corresponding, co-located pixel of the corresponding next block appears. The interleaved pixel block data move independently through the circuit, which is important in a variable length coded system with input and output data of different rates.

Figure 27:
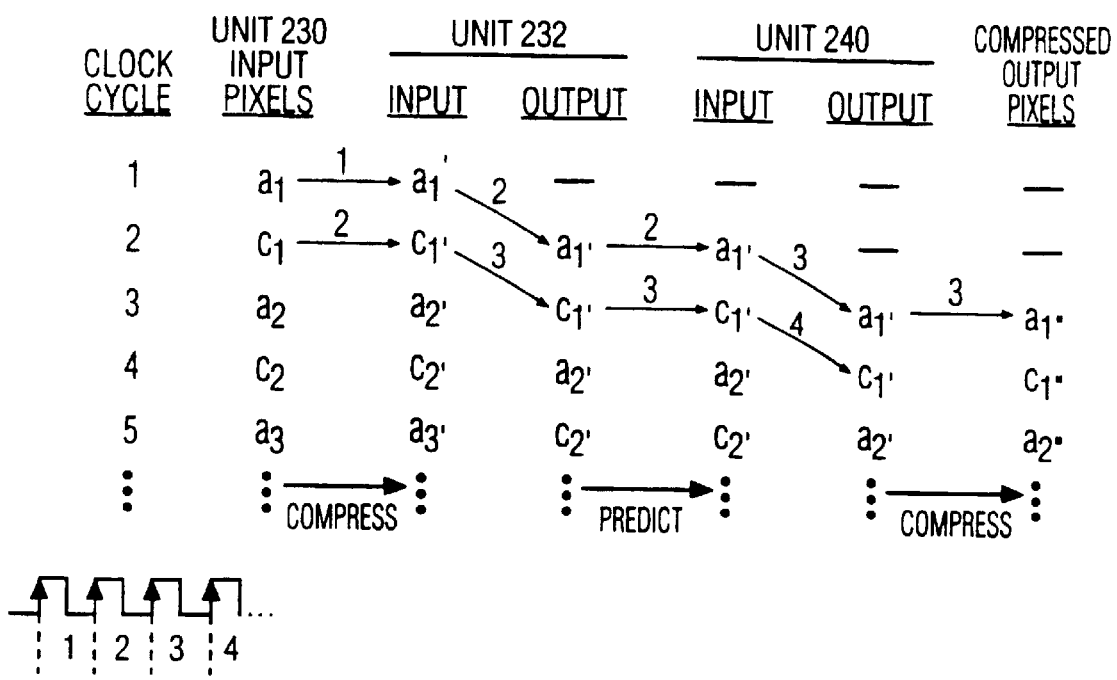
FIG. 27 is a table depicting pixel relationships during the operation of the network shown in FIG. 20.

In FIG. 20, a sequence of interleaved pixel data a, c, a, c, . . . from respective interleaved pixel blocks A, C, . . . (FIG. 5) is subjected to a one pixel delay by unit 230. A given pixel value to be compressed is applied to a non-inverting (+) input of a subtractive combiner 210. The inverting (−) input of combiner 210 receives predicted pixel values from predictor 215. The residual (difference) pixel value output from combiner 210 is subjected to quantization and inverse quantization by elements 220 and 222 respectively. The quantization provided by element 220 is fixed in this example and guarantees a desired fixed amount of data compression. Elements 230, 232, 234, 236, 238, 240 and 242 are registers (e.g., flip-flops) clocked by the 54 MHz CLK signal. Elements 230, 232, 240 and 242 ($Z^{-1}$) exhibit a one clock cycle delay. It takes two clocks to advance one pixel because of data interleaving. Elements 238, 234 and 236 exhibit two, six and eight clock cycle delays, respectively, as a consequence of the network processing a datastream of two interleaved pixel blocks. The output of inverse quantizer 222 approximates the input to quantizer 220 but differs by a small DC offset caused by quantization error. The output of adder 228, Input', differs from the Input signal to combiner 220 by this same amount. The timing relationship of a sequence of interleaved input pixels a, c, . . . over several clock cycles, with respect to selected circuit elements of FIG. 20, is shown in FIG. 27 and will be discussed in detail subsequently.

The network of FIG. 20 also includes an adder 228 and multiplexers 225 and 235 arranged as shown. These multiplexers comprise the pixel prediction network in association with predictor logic 215 and pixel delay elements 234, 236 and 238. The switching state of Mux 235 is determined by luminance (Y) and chrominance (C) control signals applied thereto. The Y, C control signals are produced as a function of the luminance and chrominance block interleaving as shown in FIG. 3. The appearance of control signals Y, C results from a pixel counting/timing process so that chrominance pixels are processed in sequence after macroblock luminance pixels. The Y and C control signals are used to control the amount of delay in the predictor circuit as appropriate for 8×8 luminance block processing or 4×8 chrominance block processing. Processing of chrominance pixels is enabled when a "1" logic level control signal is applied to mux 235, causing mux 235 to pass data appearing at its "1" input. Processing of luminance pixel data is enabled when a "0" logic level control signal is applied to mux 235, causing mux 235 to pass data applied to its "0" input from the output of delay unit 236. In the case of an 8×8 luminance block, the "x" predictor pixel is 8 pixels away. Mux 235 switches input delay paths to produce this greater delay.

Compressed (quantized) residual pixel output data is produced at the output of quantizer 220. This compressed data (FIG. 6) is subjected to a one clock cycle delay by unit 242 before being subjected to further processing including Huffman coding.

Two flip-flop delay elements, 232 and 240, are noted in particular. The use of elements 232 and 240 produces dual delay paths Δ1 and Δ2 and permits the prediction of adjacent pixels rather than every other pixel. Delay path Δ1 comprises circuit components between the output of delay 232 and the input of delay 240. Delay path Δ2 comprises circuit components between the output of delay 240 and the input of delay 232. Each of delay units 232 and 240 represents a one clock delay of approximately 18 nanoseconds, or one 54 MHz clock cycle. With this arrangement a compressed output pixel is clocked out of the circuit at the time a pixel to be compressed is being clocked into the circuit. Thus a compressed output pixel is produced for every input pixel to be compressed, in real time.

In other systems the principles discussed above could be used with four-times interleaving, i.e., four data pipelines and four instead of two delay paths in the system of FIG. 20. Critical processing loops can then be divided into four parts to facilitate synchronizing, which may permit the use of a faster clock. Also in this case, a shared look-up table would conserve integrated chip area. Although the input pixel blocks are interleaved in this example, the input data need not be interleaved in all systems.

The use of dual delay paths Δ1 and Δ2 facilitates tailoring the overall network delay as needed, e.g., approximately 18 nanoseconds delay in this case. In this regard it is noted that the extensive signal processing associated with each delay path provides various means for tailoring the delays. The delays exhibited by the two delay paths are not critical. The circuits are preferably optimized around the clock so that each delay exhibits approximately one clock cycle of the periodic 54 MHz clock. However, in other systems it may be appropriate to tailor the clock cycles with respect to a given circuit, e.g., to produce irregular or non-periodic clock cycles. The two delay paths need not exhibit equal signal processing delays, but approximately equal delays are preferable in the disclosed system.

Two signal processing paths such as Δ1 and Δ2 can be optimized for signal processing delay more easily than one overall path such as would be the case in the absence of elements 232 and 240. In the case of two paths as defined by elements 232 and 240, each path can begin operating without waiting for the results from the other path. In the case of a single path system, each pixel value (e.g., the pixel value at the node at the input to elements 234, 215 and 225) must be processed by several functions, including predictor logic, adder, quantization and inverse quantization, and appear at the end of the path before the beginning of the next clock cycle. In addition, such pixel value must be stable at such time. This is a severe constraint which is not present in the disclosed multiple path system, which exhibits more freedom.

The arrangement of FIG. 20, when embodied in hardware such as an integrated circuit, is capable of producing a compressed pixel output for every pixel input, in real time at a 54 MHz clock rate. The FIG. 20 arrangement affords more freedom to tailor signal processing delays and consumes significantly less surface area in an integrated device to produce the same result. Moreover, the reduced surface area exhibits less capacitance, resulting in faster operating speed capability and less power consumption. The use of a faster clock is also possible. In such case interleaving will still produce a benefit in terms of reduced integrated circuit area (e.g., fewer compression units and associated supporting units) and better system optimization using automated design tools.

With one clock all logic gates must be synthesized at one time. The use of two delay paths as discussed greatly simplifies the synthesis of logic gates for both compressor and decompressor networks when the integrated circuit design involves the use of VHDL high level language code (as known) from which the gates are synthesized. With two delay paths, the automatic logic design converges quickly so that gates are synthesized faster, more accurately and more reproducibly.

Besides facilitating a more reproducible design, the described dual processing paths in FIG. 20 promote the use of interleaving to produce a bandwidth advantage and the use of shared logic elements (e.g., look-up tables). Such dual processing paths also facilitate partitioning the design into functional cells or modules as required by a particular system, such as prediction and compression calculation functions in this embodiment. Such modules can be tailored as needed to suit the requirements of a particular system design.

With regard to interleaved compressor operation it is noted that it has been found preferable to use one compressor with interleaved data using two cycles of a given fast clock than to use two compressor circuits each clocked at half the given clock. Using two cycles of one clock facilitates timing optimization via interleaving as discussed, and interleaving allows twice as much data to be processed. In the disclosed system, prediction of a given pixel value is performed during one clock cycle while calculations (such as quantization and inverse quantization) for that pixel are performed during the next clock cycle. For example, for interleaved pixel blocks A and C, pixel data from block A is predicted during one 54 MHz clock cycle while quantization calculations are being performed on pixel data from block C. During the next clock cycle, block A pixel data is subjected to quantization calculations while block C pixel data is being predicted. Thus the system alternately predicts and calculates for different interleaved blocks. Using two cycles of the 54 MHz clock affords the opportunity to optimize circuit delays using appropriate tools available for hardware circuit fabrication. The process of alternatively predicting pixel values and calculating compression values is illustrated by FIG. 27.

FIG. 27 illustrates the process by which interleaved pixels "a" and "c" of associated interleaved pixel blocks A and C are processed over several cycles of the 54 MHz compression clock. Assume processing begins with first pixel a1 of first pixel block A1. Considering FIG. 27 with FIG. 20, the first clock cycle causes pixel a1 to be clocked from the input of register (flip-flop) 230 to its output, whereby pixel a1 is quantized (compressed) by unit 220 and inverse quantized by unit 222 before appearing at the input of register 232, all within the first clock cycle. At this point pixel a1 is designated as pixel a1' because pixel a1 at this point approximates input pixel a1 but exhibits a small DC offset due to quantization error associated with processing by units 220 and 222.

The second clock cycle causes the next pixel to appear, namely first interleaved pixel c1 of interleaved pixel block C1, to be processed in a manner similar to that described above for pixel a1. In addition, the second clock cycle causes pixel a1' to be clocked to the output of register 232 and thereby to the prediction network including units 215 and 225. This results in a predicted value of pixel a1' appearing at the input of register 240. Thus during the second clock cycle pixel c1 is compressed (quantized) while previously compressed pixel a1' is subjected to predictive processing.

During the third clock cycle, predictively processed pixel a1' is conveyed to the output of register 240, subtractively combined in unit 210, compressed by unit 220 and appears as compressed output value a1" at the input of output register 242. Pixel a1" is clocked from this register to subsequent Huffman coding circuits on the next clock cycle. Also during the third clock cycle, while compressed pixel value a1" is being produced, interleaved pixel c1' is being subjected to predictive processing by unit 215. This process continues for the remaining $a_n$, $c_n$ pixel of interleaved blocks A and C, whereby during each clock cycle interleaved pixels are subjected to prediction and compression processing, respectively.

Without data interleaving, processing would have to progress from pixel value a1, for example, to compressed output value a1" in one clock cycle. This requirement presents a severe speed and timing constraint which is avoided by interleaved processing as described. Interleaved processing also permits shared quantization and inverse quantization logic, resulting in less integrated circuit area and power consumption.

The described interleaved compressor operation can be used independent of MPEG compression, and as such represents an economical processing system for use in consumer video applications (e.g., home video systems such as VCRs and camcorders) to provide predictive compression of 25%–50% where more complex and expensive MPEG compression is not required.

Four rather than two interleaved pixel blocks could also be used, with a faster clock. In such case an entire block of four 8×8 luminance pixel blocks could be processed at once.

Figure 21:
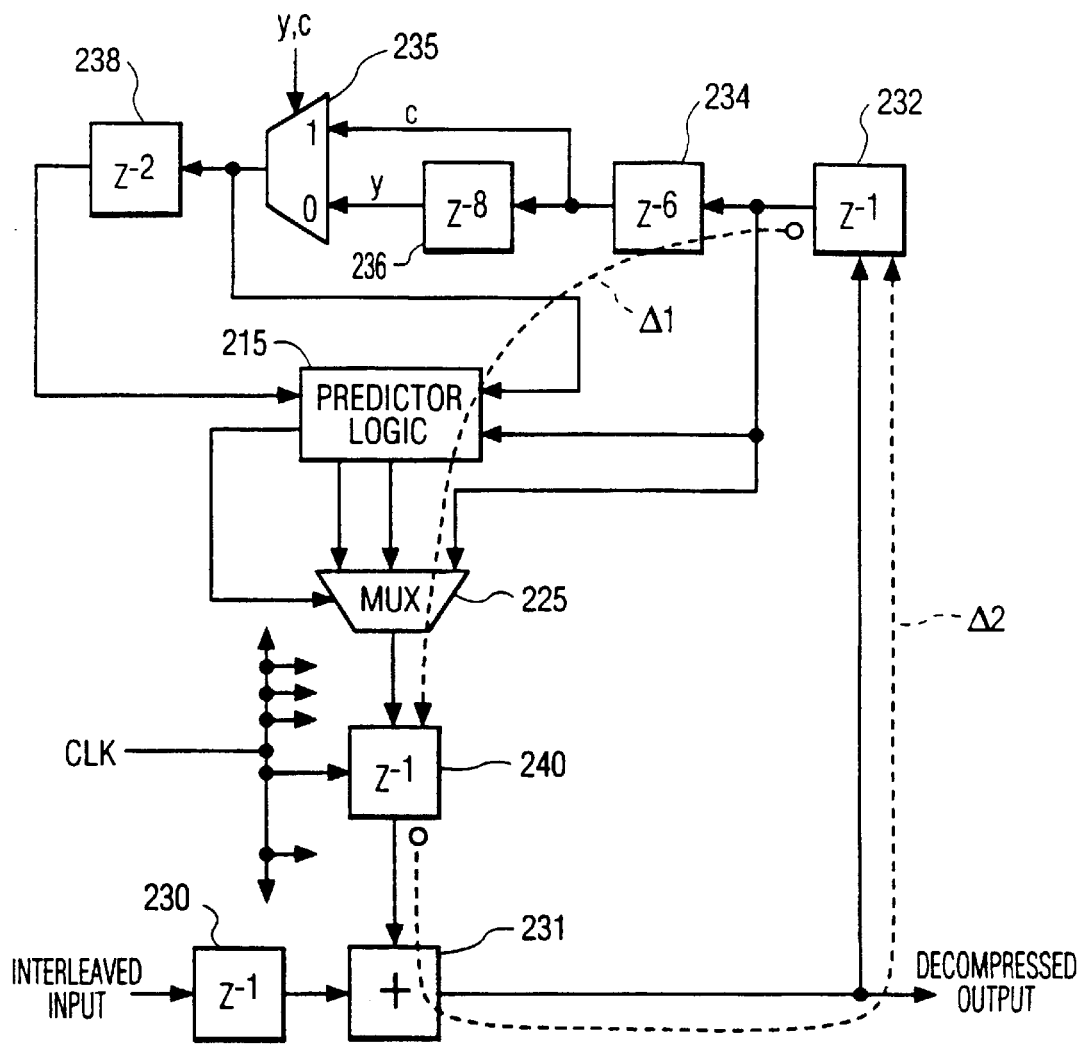
FIG. 21 shows details of a decompression network of FIG. 1.

In the disclosed system each decompressor network is arranged as shown in FIG. 21. The decompressor circuit is similar to the compressor circuit of FIG. 20 except that element 210 is a 9-bit adder and elements 220, 222, 228 and 242 have been removed. Path Δ2 involves less processing than path Δ1. However, even the inclusion of 9-bit adder 231 in path Δ2 adds a time constraint of about 9 milliseconds, which complicates the decompressor design. In this regard it is noted that adder 231 cannot begin computing until mux 225 has received valid data. Thus it is beneficial to reduce loop timing constraints. The use of dual delay paths accomplishes this as well as greatly simplifying the overall design.

For decompression, prediction path Δ1 has been found to be the more important path. Path Δ2 has been found to be more important in the case of compression, where intensive data manipulations dictate the use of a slower 54 MHz clock.

As noted previously, each decompressor in network 80–84 operates independently so that pixel data are delivered quickly. The transfer of data is often accomplished by means of clocked devices, such as flip-flops or registers. When the data to be pipelined are derived from two or more sources, e.g., in the case of interleaved data, at any moment in time the data in some registers is from one source while data in other registers is from another source. The data flow together in response to a common data clock, but the data in successive registers are mutually independent. System operating problems can be avoided when both data sources are started and stopped synchronously as long as the datastream (pipeline) is started and stopped at the same time.

A problem occurs when one source stops sending data while the other source continues to send data. In data intensive pipelines such as in HDTV signal processors, the large number of calculations/second are critical to producing an accurate, high quality image for display. Such systems cannot afford to interrupt the dataflow whenever one or two (or more) data sources stop sending data. In such cases it is important to control the pipeline dataflow so that proper phasing of output data provided from an uninterrupted source is maintained when the other data source is interrupted.

It is important that the data clock not be stopped in a data intensive image processing system such as an HDTV system. In such systems certain components such as compression and decompression subsystems have different input and output data processing requirements and different data rates. For example, decompressed output pixel data for display must be output continuously, which requires a continuous clock, but compressed input data to be decompressed may arrive sporadically with null intervals when a clock is not present. If the decompression clock were stopped when input data is absent, clocking out of decompressed pixel data would also stop. This would be disruptive in a data intensive high definition image processing and display system. Thus repeating data is advantageous under certain conditions as will be discussed, particularly when Huffman decoding is employed in the decompression process.

In the disclosed system, the output of the compression network (FIG. 20) is subjected to Huffman coding. Huffman decoding is associated with decompression at a decoder. Since Huffman coding/decoding is a statistical process with different input and output data rates due to different coded word lengths, buffers are used to accommodate variable data content.

Figure 23:
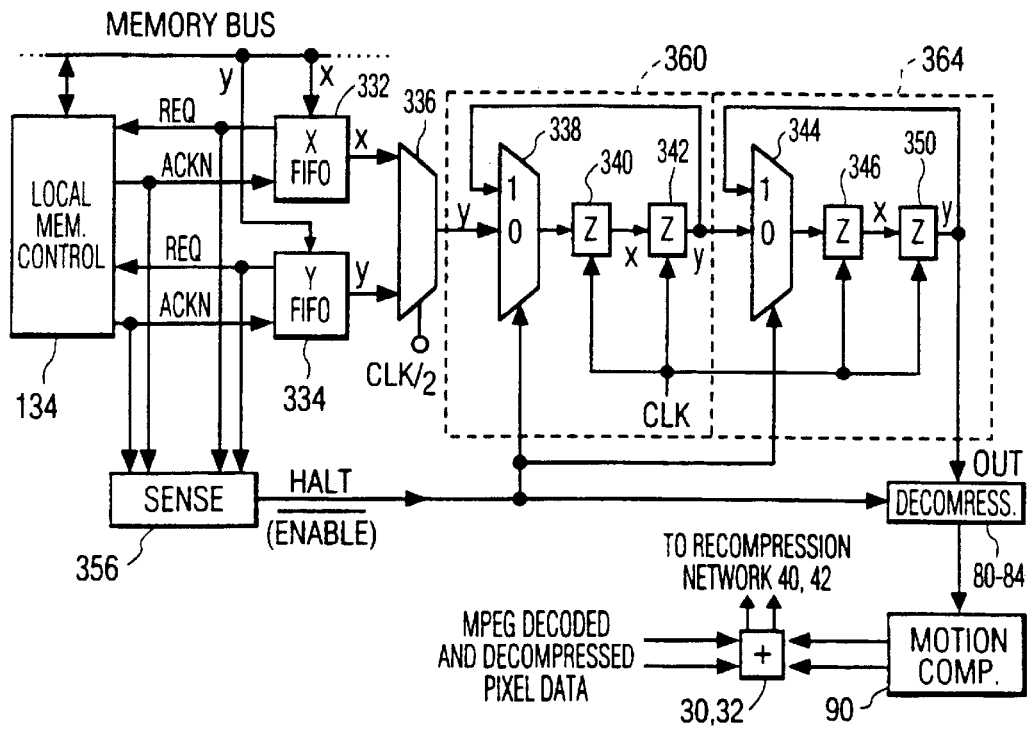
FIGS. 23–26 illustrate a data flow control operation for the system of FIG. 1.
Figure 24:
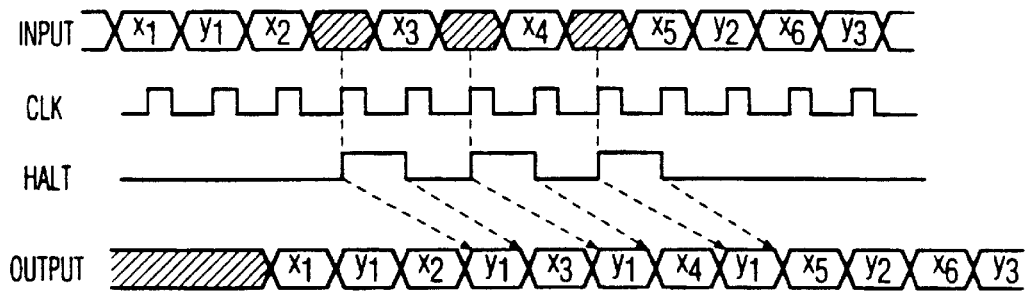

As will be seen with respect to FIGS. 23 and 24, when data from separate sources are processed by a pipelined sequence of registers, feedback from every other register is used to keep one data component (from a first source) flowing through the pipeline, while the other data component (from a second source) is kept repeating upon itself. With this technique, with interleaved data from sources, data can be processed through the pipeline at a desired, predicted rate when one of the data sources has stopped providing data.

Repeating data is equivalent to stopping the data clock but without start-stop synchronization problems. The use of repeating data is preferred to using no data (e.g., null words) since data cycles would be lost in recovering delays. Repeating data is important to maintaining the integrity of data flow and is not as disruptive as sending no data.

The data repeating process can repeat data for the duration of an 8×8 pixel block (64 clock cycles) without introducing system complications. Longer repeating delays are also possible depending on the nature of the system and associated processing. For example, in the course of pixel prediction processing, up to six blocks will be stored in memory. In such case, one block can effectively be held in place (repeated) in the presence of a source disruption while other blocks are being acquired from memory. It is expected that repeat delays over 1 or 2 macroblock intervals can be tolerated.

Repeating data is preferable to adding null data when a source disruption occurs because processing null data is less efficient. Like other data, null data is stored in memory, and clock cycles are wasted recovering from a null data condition, e.g., reloading valid data after nulls are removed. This is an important consideration in a data intensive system such as a high definition television system, where memory bandwidth is very important and the number of clock cycles required for data processing should be reduced as much as possible.

In FIG. 23 the input pipes respectively convey data X and Y from separate data sources, e.g., from separate locations in a memory such as frame memory 60 in FIG. 1. Data X and Y are mutually independent and are in no particular order, i.e., they may or may not be interleaved, and represent any pixel data requested from memory. In this example the X and Y data respectively represent forward and backward motion information for use by the motion compensation network (FIG. 1). The X data must be processed even if Y data is not present, and vice-versa.

The circuit of FIG. 23 conveys data from memory 60 to decompressor network 80–84 in FIG. 1, and is well-suited to MPEG processing. An MPEG coded P or B picture could be produced, but it may happen that a given macroblock may not have one or the other of forward or backward data for processing. The arrangement of FIG. 23 recognizes this possibility.

Input FIFO buffers 332 and 334 are associated with each input for a block of data. In this example buffers 332 and 334 represent the input buffers for each decompressor 80, 82 and 84 in FIG. 1. Each buffer sends a signal Req requesting data from memory via memory controller 134 at appropriate times (e.g., in response to processing involving single versus dual direction predictions), and receives a return acknowledgment signal Ackn that data is available to be sent. The flow of data between the memory sources and the buffers is controlled by data Read/Write control signals as known.

The input X, Y data is multiplexed onto a common data line by means of a Mux 336 in response to a CLK/2 data clock, producing a pipeline of alternating X, Y data at the output of Mux 336. Data from Mux 336 is processed by a series of feedback register sections 360 and 364. The number of sections used is a function of the number of interleaved data elements, two in this case. Section 360 includes an input multiplexer 338 and cascaded registers (flip-flops) 340 and 342 arranged as shown. Each register element is clocked at 81 MHz by the CLK signal. Section 364 is arranged similarly. The output of the last register element 350 is applied to the data decompression network of FIG. 1, which decompresses data including forward and backward motion prediction information. Data must be decompressed as soon as it is received by the decompressor. The decompressor cannot wait until X, Y buffers 332, 334 are filled. In each register section feedback is provided from the output of the last register in that section to a switching control input of the associated multiplexer, e.g., from the output of register 342 to the "1" input of Mux 338. The network constituted by feedback register sections 360 and 364 operates as a selective digital sample and hold network with two operating modes. In one mode data is sampled and held to produce data repeat operation. In another mode data is transmitted normally, without repetition.

Unit 356, e.g., a digital comparator, senses the state of the Req and Ackn signal lines. If a FIFO buffer generates a Req signal and a return Ackn is not received from the memory source, unit 356 generates a data Halt signal at a "1" level, or state. Data flows normally through the pipeline when the Halt signal exhibits a "0" state, but data are repeated as explained below when the Halt signal exhibits a "1" state. When an Ackn signal is not received from a given input, the Halt signal causes the last valid data component to be repeated, or recirculated, in each register section. This is illustrated by the waveforms of FIG. 24 as will be discussed. If an Ackn signal is not received from both X and Y input data sources, the clock is stopped and no data is recirculated.

Figure 25:
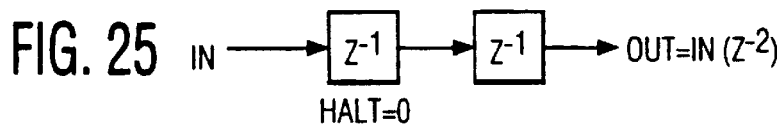
Figure 26:
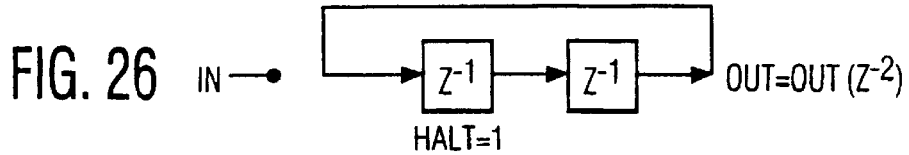

Thus when the Halt signal exhibits a 0 level such that data flows normally through the pipeline, input data X and Y are maintained in the proper interleaved (clock) phase relationship so that clocking causes output data to alternate between source X data and source Y data. This phase relationship is important to prevent mixing data. In this case the output data of each register section (e.g., at the output of registers 342 and 350) corresponds to the input data two clocks earlier (e.g., Output=Input ($Z^{-2}$)). When the Halt signal exhibits a 1 level, the associated Mux (338 or 344) decouples the input signal from the output so that each register section simply recirculates data. These operating conditions are illustrated by FIGS. 25 and 26 respectively.

FIG. 24 illustrates a condition where, for example, the Halt signal exhibits a 1 level only when certain data from the source of Y data have stopped. While the Halt signal is active, the Y data is recirculated (repeated) until the Halt signal returns to a normal 0 level and Y data flows again. During this time data from source X flows without interruption. In FIG. 24 the Input waveform contains an interleaved sequence of X and Y data components. In this example an Ackn signal has not been received for the Y2 component following component X2. Thus the normally "0" state of the Halt signal from unit 356 changes to a "1" state, causing each register section 360 and 364 to repeat the last valid Y component, in this case Y1, as long as the Halt signal exhibits the "1" state. The Halt signal is coupled to a control input of multiplexers 238 and 244 such that a "1" state of the Halt signal causes each multiplexer to convey the signal coupled to its "1" switching input, in this case the Y data components.

The shaded components of the Input signal waveform represent the missing Y2 component, i.e., no Y component is being issued by the second source after component Y1. The Y1 component is repeated for three Req/Ackn cycles, whereby three Halt signals are generated and component Y1 is repeated three times, as shown in the Output waveform of FIG. 24. Afterwards, the second source generates an Ackn signal for component Y2, which appears in the Output waveform sequence following data component X5.

The Halt signal is also provided to a control input of the associated decompressor network for instructing the decompressor to ignore the repeated data in the datastream. As mentioned previously, the interleaved X, Y data components are independent and need not follow each other in any particular (numerical) sequence. It is only necessary that data associated with a given input follow a prescribed sequence, e.g., X5 follows X4, which follows X3, which follows X2 and so on. It is of no consequence that, for example, Y2 follows X5.

Figure 28:
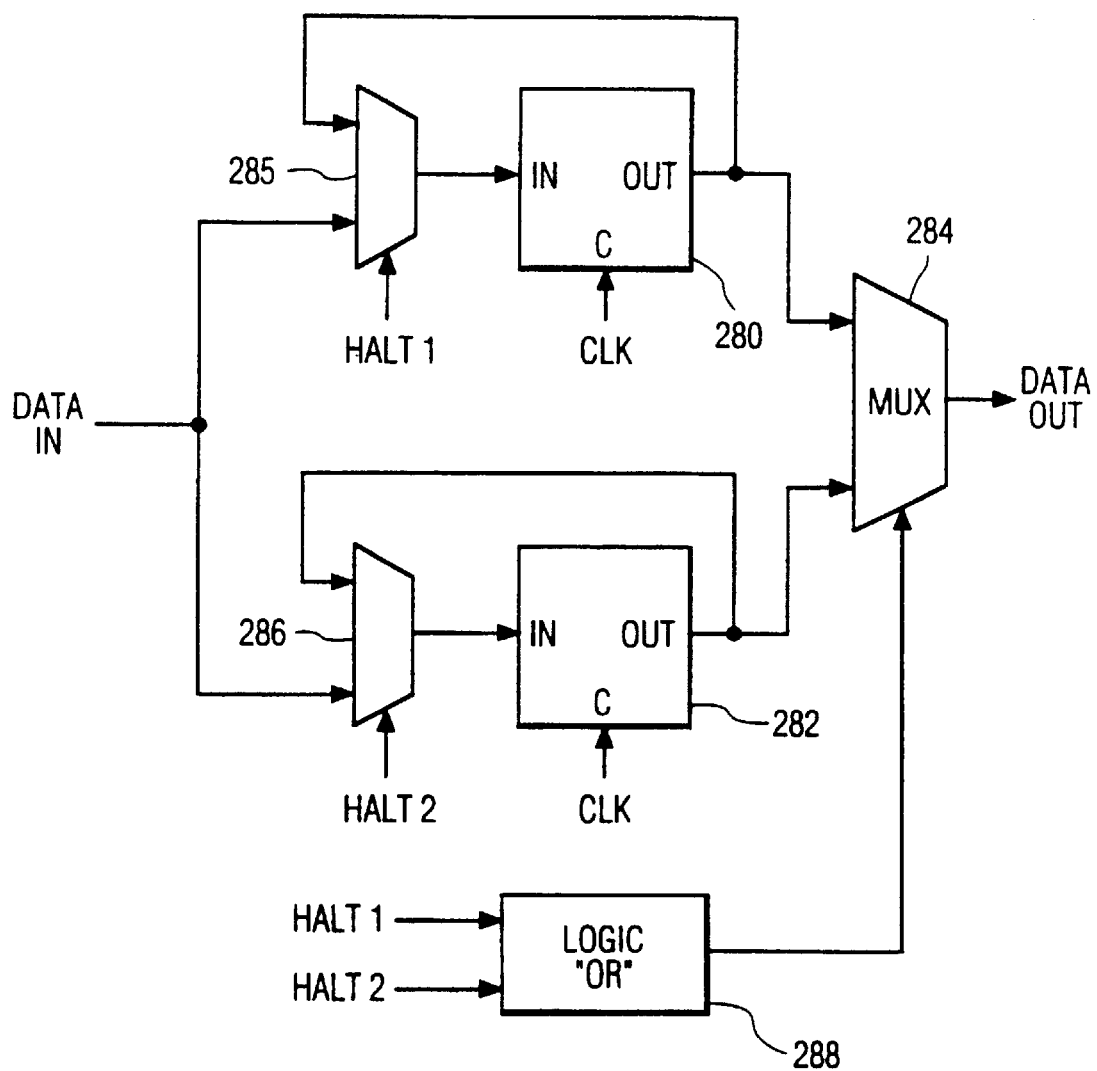
FIG. 28 depicts an alternative arrangement of the network shown in FIG. 23.

FIG. 28 depicts the network of FIG. 23 arranged for parallel operation. Interleaved input data from Mux 336 (FIG. 23 is provided via multiplexers 285 and 286 to parallel registers 280 and 282 Outputs from these registers are multiplexed onto a data output path via Mux 284. The operation of multiplexers 284, 285 and 286 is controlled by Halt 1 and Halt 2 control signals which are associated with respective sources and produce an effect as described in connection with FIG. 23.

What is claimed is:

1. In a system for processing a datastream of MPEG coded image representative data, an MPEG compatible signal processing system comprising:

a decompressor for decompressing MPEG compressed data to produce decompressed data;

a data reduction network for data-reducing said decompressed data to produce data-reduced information, said data reduction network comprising a recompression network and a subsampling network;

an image data processor responsive to said data-reduced information; and a control network for inhibiting said recompression network selectively when said subsampling network is activated.

2. A system according to claim 1, wherein said recompression network comprises a plurality of compressors; and said control network inhibits one of said compressors when said subsampling network is activated.

3. A system according to claim 2, wherein said subsampling network responds to said decompressed data to produce subsampled decompressed data;

said compressors are arranged in parallel for processing predetermined components of a datastream containing said subsampled decompressed data, to produce recompressed data;

said recompressed data is stored in memory.

4. A system according to claim 2, wherein
said control network removes power from the inhibited one of said compressors.

5. A system according to claim 1, wherein said recompression network and said subsampling network are arranged in a DPCM loop further including
 a decompression network for decompressing stored recompressed data; and
 a motion compensation processing network.

6. A method for processing a datastream of compressed MPEG coded image representative data, comprising the steps of:
 decompressing MPEG compressed data to produce decompressed data;
 data-reducing said decompressed data to produce data-reduced information by means of recompressing data and subsampling data; and
 selectively inhibiting said recompressing step when said subsampling step is activated.

7. A method according to claim 6, further comprising the step of
 storing said recompressed data in memory; wherein
 said subsampling step subsamples said decompressed data to produce subsampled decompressed data;
 said recompressing step comprises multiple compressing functions operating in parallel for processing predetermined components of a datastream containing said subsampled decompressed data, to produce said recompressed data; and
 said inhibiting step inhibits one of said multiple compressing functions when said sampling step is activated.

8. A method according to claim 6, wherein
 said inhibiting step involves removing power from a data compression network.

* * * * *